(12) United States Patent
Ooishi

(10) Patent No.: US 6,806,524 B2
(45) Date of Patent: Oct. 19, 2004

(54) THIN FILM MAGNETIC MEMORY DEVICE

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/622,514

(22) Filed: Jul. 21, 2003

(65) Prior Publication Data
US 2004/0140492 A1 Jul. 22, 2004

(30) Foreign Application Priority Data
Jan. 21, 2003 (JP) ........................................ 2003-011939

(51) Int. Cl.⁷ .............................................. H01L 31/062
(52) U.S. Cl. ................. 257/295; 257/421; 257/E27.104
(58) Field of Search ................................ 257/295, 421, 257/E27.104

(56) References Cited

U.S. PATENT DOCUMENTS 6,165,803 A  12/2000 Chen et al.
6,174,737 B1 * 1/2001 Durlam et al. ................. 438/3
6,560,135 B2 * 5/2003 Matsuoka et al. ............. 365/97

FOREIGN PATENT DOCUMENTS

JP        2002-110938        4/2002

* cited by examiner

Primary Examiner—David Nelms
Assistant Examiner—Tu-Tu Ho
(74) Attorney, Agent, or Firm—McDermott Will & Emery LLP

(57) ABSTRACT

A thin film magnetic memory device includes: TMR elements provided at a predetermined distance away from each other on a main surface of a silicon substrate so as to operate as memory elements; a first digit line for applying a magnetic field to TMR element, extending in one direction so as to intersect TMR element; a second digit line for applying a magnetic field to TMR element, extending parallel to the first digit line so as to intersect TMR element; and a magnetic film provided so as to fill in the space between the first digit line and the second digit line and so as to bring into contact with the first and second digit lines. The present invention provides a thin film magnetic memory device wherein crosstalk can be prevented from generating between adjacent memory cells and wherein wire resistance does not increase.

12 Claims, 22 Drawing Sheets

THIN FILM MAGNETIC MEMORY DEVICE

BACKGROUND OF THE INVENTION

1. Field of the Invention

The present invention generally relates to a thin film magnetic memory device and, more particularly, to a thin film magnetic memory device wherein magnetic memory cells forming separate memory cells are provided in proximity to each other.

2. Description of the Background Art

In recent years, research has been performed concerning MRAMs (Magnetic Random Access Memories) as next-generation semiconductor memory devices. As for the memory cell configuration of an MRAM, a so-called one transistor-one MTJ (Magnetic Tunnel Junction)-type MRAM configuration formed of a TMR (Tunneling MagnetoResistive) element, which includes a magnetic tunnel junction (MTJ), and of one transistor can be cited as an example. In a memory cell of such an MRAM, a digit line extends beneath the TMR element via an insulator film. In addition, a bit line extends in a manner that intersects the digit line so as to bring into contact with the top surface of the TMR element. Thus, a magnetic field generated by currents that are made to flow through the digit line and through the bit line is used so as to change the direction of magnetization in a ferromagnetic layer, which is a free layer forming a magnetic tunnel junction in the TMR element and, thereby, rewrite of data in the memory cell is carried out.

Respective TMR elements forming memory cells independent of each other, however, are provided in proximity to each other in order to achieve miniaturization of the MRAM. Therefore, a problem arises wherein an unexpected magnetic field is generated in a second TMR element adjacent to a first TMR element, which forms one memory cell, in the case where currents are made to flow through a digit line and through a bit line in order to generate a predetermined magnetic field in the first TMR element.

In addition, a magnetic memory device having the purpose of reducing the power consumption at the time of write-in is disclosed in Japanese Patent Laying-Open No. 2002-110938. The magnetic memory device disclosed in above literature is an MRAM and is formed of a magnetic memory element and a transistor. The magnetic memory element is provided with wires intersecting each other at right angles and a ferromagnetic double tunnel junction located at the location wherein these wires intersect each other. Each of the wires intersecting each other at right angles is provided with a magnetic film covering the side opposite to the side facing the ferromagnetic double tunnel junction, as well as the remaining sides, and the side of the wire that faces the ferromagnetic double tunnel junction is exposed from the magnetic film.

According to the magnetic memory device of such a configuration, in the case where a magnetic field for write-in is applied to one of two adjacent memory cells, the effects given to the other memory cell by this magnetic field can be reduced. Thereby, crosstalk generating between the two adjacent memory cells can be effectively prevented.

In the magnetic memory device disclosed in above literature, wires are covered with magnetic material and the magnetic material is utilized as a shield for suppressing the generation of crosstalk. In order to cover the wires with the magnetic film, first, a trench is formed in an interlayer insulating film and this trench is filled in with a magnetic material. Then, another trench for a wire is formed in the magnetic material and is filled in with a conductor film for a wire. In addition, according to another manufacturing method, a trench for a wire is formed in the interlayer insulating film and, at the same time, this trench for a wire is filled in with a magnetic material and a conductor film.

The pitch according to which the trenches are formed in the interlayer insulating film, however, cannot be reduced to a constant level, or less, due to limitations in the photolithographic process for the formation of trenches. On the other hand, it is necessary at present to reduce the pitch according to which the trenches are formed to be as small as possible because miniaturization of semiconductor devices is required. Because of these reasons, the pitch according to which the trenches are formed has been determined to be a predetermined value.

Under such conditions, the width of the wires is reduced by the thickness of the magnetic material in the case where the wires are covered with magnetic material and, then, the thickness of the magnetic material must be taken into consideration. In addition, the height of the wires is reduced by the thickness of the magnetic material in the same manner in the case where the height wherein trenches for a wire are formed is determined by a structure beneath the wires. In the case where the width of the wires and the height of the wires are reduced in the above described manner, the area of the cross section of the wires is reduced so as to increase the resistance of the wires. This increase in the resistance of the wires hinders currents that are made to flow through the digit line and through the bit line so as to generate magnetic fields and a problem arises wherein a sufficient magnetic field cannot be generated in the TMR element.

In addition, it becomes necessary to carry out a photolithographic exposure process twice in the case where a manufacturing method is adopted so that trenches are formed twice in the interlayer insulating film in order to cover the wires with a magnetic film. Therefore, a mask shift generates and a problem arises wherein the thickness of the shield made of the magnetic material differs depending on the locations of the wires. In addition, in the case where a manufacturing method is adopted so that a magnetic material and a conductor film are filled in at the same time, a problem arises wherein the thickness of the wires becomes uneven due to dispersion in the thickness of the magnetic material that is used for the initial fill in and the wires cannot be formed at predetermined locations.

SUMMARY OF THE INVENTION

Therefore, an object of the present invention is to solve the above described problem and to provide a thin film magnetic memory device wherein crosstalk generating between adjacent memory cells is suppressed and wherein the wire resistance is not increased.

A thin film magnetic memory device according to the present invention includes: first and second magnetic memory cells provided on a main surface of a semiconductor substrate at a predetermined distance away from each other so as to operate as memory cells; a first wire for applying a magnetic field to the first magnetic memory cell extending in one direction so as to intersect the first magnetic memory cell; a second wire for applying a magnetic field to the second magnetic memory cell extending in parallel to the first wire so as to intersect the second magnetic memory cell; and a magnetic film provided so as to fill in the space between the first wire and the second wire and so as to bring into contact with the first and second wires.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
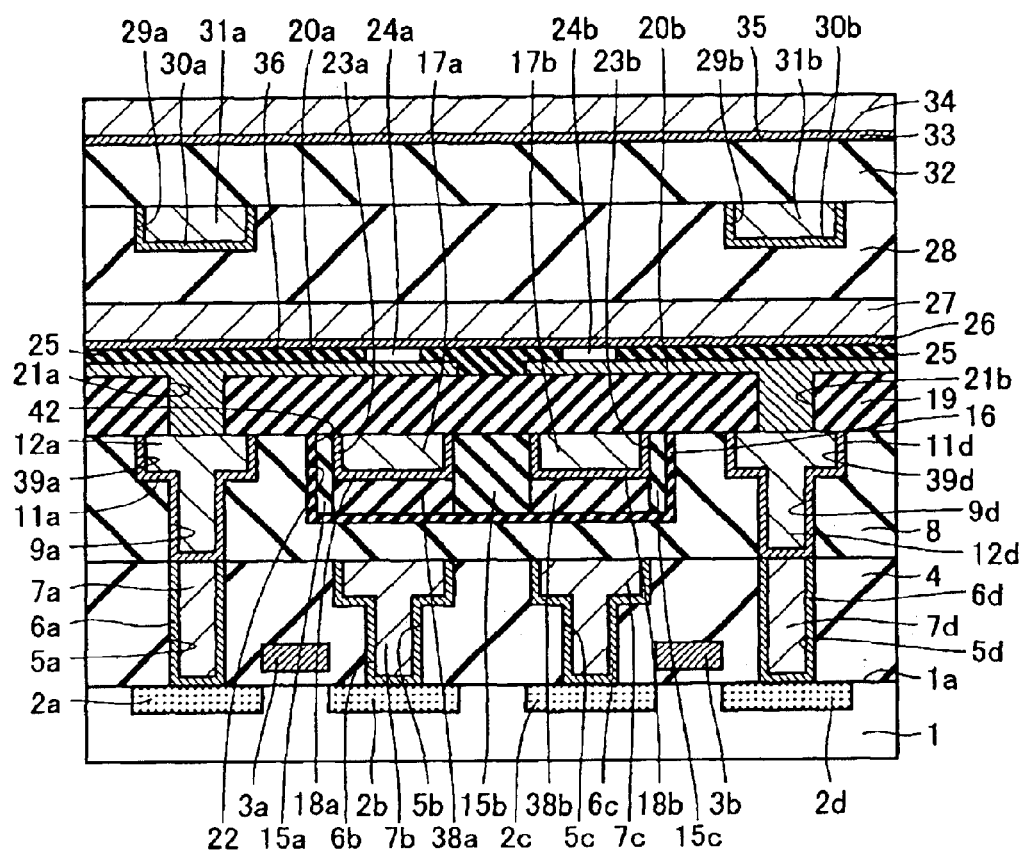
FIG. 1 is a cross sectional view showing a thin film magnetic memory device according to a first embodiment of the present invention.

FIG. 1 shows a memory cell region of a thin film magnetic memory device wherein two memory cells of an MRAM (Magnetic Random Access Memory) are formed.

With reference to FIG. 1, source/drain regions 2a to 2d are formed in main surface 1a of silicon substrate 1. A gate electrode 3a is formed above silicon substrate 1 located between source/drain regions 2a and 2b via a gate insulating film, which is not shown. One field-effect transistor is formed of source/drain regions 2a and 2b, gate electrode 3a and the gate insulating film. A gate electrode 3b is formed above silicon substrate 1 located between source/drain regions 2c and 2d via a gate insulating film, which is not shown, in the same manner as above. Another field-effect transistor is formed of source/drain regions 2c and 2d, gate electrode 3b and the gate insulating film. Gate electrodes 3a and 3b are formed of polysilicon, a layered film of polysilicon and CoSi, WSi or the like.

An interlayer insulating film 4 is formed of a silicon oxide film so as to cover main surface 1a of silicon substrate 1 and gate electrodes 3a and 3b. Contact holes 5a to 5d, respectively, which reach to source/drain regions 2a to 2d, are formed in interlayer insulating film 4. Source/drain regions 2a to 2d define the bottom of contact holes 5a to 5d. Portions of contact holes 5b and 5c are formed in interlayer insulating film 4 from the top surface of interlayer insulating film 4 so as to extend in the direction perpendicular to the surface of the paper of FIG. 1.

Barrier metal films 6a to 6d are formed so as to cover the inner walls of contact holes 5a to 5d. Barrier metal films 6a to 6d are formed of a barrier metal such as titanium nitride (TiN) or tantalum nitride (TaN). Contact plugs 7a to 7d are formed on barrier metal films 6a to 6d so as to completely fill in the insides of contact holes 5a to 5d. Contact plugs 7a to 7d are formed of a conductive material such as copper (Cu), aluminum (Al), tungsten (W), or titanium (Ti).

An interlayer insulating film 8 is formed of a silicon oxide film on interlayer insulating film 4. A contact hole 9a, which reaches to contact plug 7a and to barrier metal film 6a is formed in interlayer insulating film 8. A contact hole 9d, which reaches to contact plug 7d and to barrier metal film 6d is formed in interlayer insulating film 8. Contact holes 39a and 39d, which continue to contact holes 9a and 9d, respectively, having diameters greater than those of contact holes 9a and 9d are formed in interlayer insulating film 8 from the top surface of interlayer insulating film 8.

Barrier metal films 11a and 11d are formed so as to cover the inner walls of contact holes 9a and 9d as well as contact holes 39a and 39d. Barrier metal films 11a and 11d are formed of a barrier metal such as titanium nitride or tantalum nitride. Contact plugs 12a and 12d are formed on barrier metal films 11a and 11d so as to completely fill in the insides of contact holes 9a and 9d as well as contact holes 39a and 39d. Contact plugs 12a and 12d are formed of a conductive material such as copper, aluminum, tungsten or titanium.

A trench 22 for shielding is formed in a portion of interlayer insulating film 8 located above contact plugs 7b and 7c. Trench 22 for shielding extends in the direction perpendicular to the surface of the paper of FIG. 1. The inner walls of trench 22 for shielding are defined by interlayer insulating film 8. A magnetic film 16 is formed so as to cover the inner walls of trench 22 for shielding. A trench 42 is further defined by a magnetic film 16 inside of trench 22 for shielding.

Magnetic films 15a and 15c are formed at a predetermined distance away from each other so as to bring into contact with each of the sidewalls of trench 42a facing each other inside of trench 42. A magnetic film 15b is formed between magnetic film 15a and magnetic film 15c at a distance away from magnetic films 15a and 15c. The top surface of interlayer insulating film 8 and the top surfaces of magnetic films 16 and 15a to 15c are provided in the same plane. Magnetic films 16 and 15a to 15c are formed of a magnetic material made of an oxide of manganese (Mn), zinc (Zn) or iron (Fe). Magnetic films formed of these materials exhibit physical property values such as relative permeability in the several thousands and specific electrical resistance of from $10^8$ $\mu\Omega$·cm to $10^{12}$ $\mu\Omega$·cm.

Insulator films 38a and 38b, respectively, are formed of silicon oxide films between magnetic film 15a and magnetic film 15b as well as between magnetic film 15b and magnetic film 15c. The top surfaces of insulator films 38a and 38b are provided at positions lower than the top surface of interlayer insulating film 8. The sidewalls of magnetic films 15a and 15b and the top surface of insulator film 38a define a trench 23a for a wire. The sidewalls of magnetic films 15b and 15c and the top surface of insulator film 38b define a trench 23b for a wire in the same manner.

Barrier metal films 18a and 18b are formed so as to cover the inner walls of trenches 23a and 23b for wires. Barrier metal films 18a and 18b are formed of a barrier metal such as titanium nitride or tantalum nitride. Conductor films 17a and 17b are formed on barrier metal films 18a and 18b so as to completely fill in trenches 23a and 23b for wires. The top surfaces of conductor films 17a and 17b and the top surface of interlayer insulating film 8 are provided in the same plane. Conductor films 17a and 17b are formed of a conductive material such as copper, aluminum, tungsten or titanium. Barrier metal film 18a and conductor film 17a as well as barrier metal film 18b and conductor film 17b formed inside trenches 23a and 23b, respectively, for wires form a first digit line and a second digit line in the memory cell of the MRAM.

The sidewalls of the first and second digit lines on the sides wherein the first and second digit lines face each other bring into contact with magnetic film 15b. Magnetic film 15b fills in the space between the first digit line and the second digit line. The distance between main surface 1a of silicon substrate 1 and the bottom of magnetic film 15b is less than the distance between main surface 1a of silicon substrate 1 and the bottoms of the first and second digit lines. The distance between main surface 1a of silicon substrate 1 and the top surface of magnetic film 15b is equal to the distance between main surface 1a of silicon substrate 1 and the top surfaces of the first and second digit lines. Magnetic films 16 and 15a to 15c cover the first and second digit lines so that only the top surfaces of the first and second digit lines are exposed.

Interlayer insulating film 19 is formed of a silicon oxide film on interlayer insulating film 8. Contact holes 21a and 21b, respectively, which reach to contact plugs 12a and 12d, are formed in interlayer insulating film 19. Straps 20a and 20b are formed so as to fill in the insides of contact holes 21a and 21b and so as to partially cover the top surface of interlayer insulating film 19. Strap 20a and strap 20b are formed so as to be separated from each other. Straps 20a and 20b are formed of a conductive material such as copper or tantalum.

One end of strap 20a and one end of strap 20b extend on the top surface of interlayer insulating film 19 so as to reach to the locations above the first and second digit lines. The other ends of strap 20a and strap 20b, respectively, bring into contact with the top surfaces of contact plugs 12a and 12b inside of contact holes 21a and 21b and, thereby, make electrical connections with the above described field-effect transistors formed in silicon substrate 1.

TMR elements 24a and 24b are formed on the top surfaces of straps 20a and 20b so as to be located above the first and second digit lines. TMR elements 24a and 24b are magnetic memory cells that include magnetic tunnel junctions. Interlayer insulating film 25 is formed of a silicon oxide film so as to cover the top surface of interlayer insulating film 19, which is exposed from straps 20a and 20b, as well as to cover straps 20a and 20b. The top surface of interlayer insulating film 25 and the top surfaces of TMR elements 24a and 24b are provided in the same plane. That is to say, TMR elements 24a and 24b are formed in the condition wherein they are embedded in interlayer insulating film 25 so that the top surfaces of TMR elements 24a and 24b are exposed from interlayer insulating film 25.

An interlayer insulating film 59, not shown, is formed of a silicon oxide film on interlayer insulating film 25. A trench 36 for a wire whose bottom is defined by the top surface of interlayer insulating film 25 extending in the direction perpendicular to the direction in which the first and second digit lines extend is formed in interlayer insulating film 59. Trench 36 for a wire is formed above the top surfaces of TMR elements 24a and 24b.

A barrier metal film 26 is formed so as to cover the inner walls of trench 36 for a wire. Barrier metal film 26 makes contact with the top surfaces of TMR elements 24a and 24b. Barrier metal film 26 is formed of a barrier metal such as titanium nitride or tantalum nitride. A conductor film 27 is formed on barrier metal film 26 so as to completely fill in the inside of trench 36 for a wire. Conductor film 27 is formed of a conductive material such as copper, aluminum, tungsten or titanium. Barrier metal film 26 and conductor film 27 formed inside of trench 36 for a wire form a bit line in the memory cell of the MRAM.

That is to say, the first and second digit lines, formed of conductor film 17a and barrier metal film 18a and formed of conductor film 17b and barrier metal film 18b, respectively, and the bit line formed of conductor film 27 and of barrier metal film 26 intersect at right angles with TMR elements 24a and 24b placed therebetween. Thus, TMR elements 24a and 24b are formed at positions wherein the first and second digit lines and the bit line intersect each other.

Interlayer insulating film 28 is formed of a silicon oxide film on interlayer insulating film 59. Trenches 29a and 29b for wires are formed in interlayer insulating film 28 from the top surface of interlayer insulating film 28. Trenches 29a and 29b for wires extend in the direction perpendicular to the surface of the paper of FIG. 1. Barrier metal films 30a and 30b are formed so as to cover the inner walls trenches 29a and 29b for wires. Barrier metal films 30a and 30b are formed of a barrier metal such as titanium nitride or tantalum nitride. Conductor films 31a and 31b are formed on barrier metal films 30a and 30b so as to completely fill in the insides of trenches 29a and 29b for wires. Conductor films 31a and 31b are formed of a conductive material such as copper, aluminum, tungsten or titanium.

An interlayer insulating film 32 is formed of a silicon oxide film interlayer insulating film 28. A trench 35 for a wire extending in the direction perpendicular to the direction in which trenches 29a and 29b for wires extend is formed in interlayer insulating film 32 from the top surface of interlayer insulating film 32. A barrier metal film 33 is formed so as to cover the inner walls of trench 35 for a wire. Barrier metal film 33 is formed of a barrier metal such as titanium nitride or tantalum nitride. A conductor film 34 is formed on barrier metal film 33 so as to completely fill in the inside of trench 35 for a wire. Conductor film 34 is formed of a conductive material such as copper, aluminum, tungsten or titanium.

One memory cell of the MRAM shown in FIG. 1 is formed of: a field-effect transistor formed of gate electrode 3a, as a word line, a gate insulating film, not shown, as well as source/drain regions 2a and 2b; strap 20a electrically connected to this field-effect transistor; TMR element 24a formed so as to bring into contact with the top surface of strap 20a; a first digit line extending beneath TMR element 24a and formed of conductor film 17a and barrier metal film 18a and a bit line extending so as to bring into contact with the top surface of TMR element 24a and formed of conductor film 27 and barrier metal film 26.

In addition, another memory cell of the MRAM shown in FIG. 1 is formed of: a field-effect transistor formed of gate electrode 3b, as a word line, a gate insulating film, not shown, as well as source/drain regions 2c and 2d; strap 20b electrically connected to this field-effect transistor; TMR element 24b formed so as to bring into contact with the top surface of strap 20b; a second digit line extending beneath TMR element 24b and formed of conductor film 17b and barrier metal film 18b and a bit line extending so as to bring into contact with the top surface of TMR element 24b and formed of conductor film 27 and barrier metal film 26.

FIG. 1 specifically shows the bit line and the digit lines, TMR elements 24a and 24b as well as magnetic films 16 and 15a to 15c. FIG. 1 is a cross sectional view taken along line I—I of FIG. 2.

Figure 2:
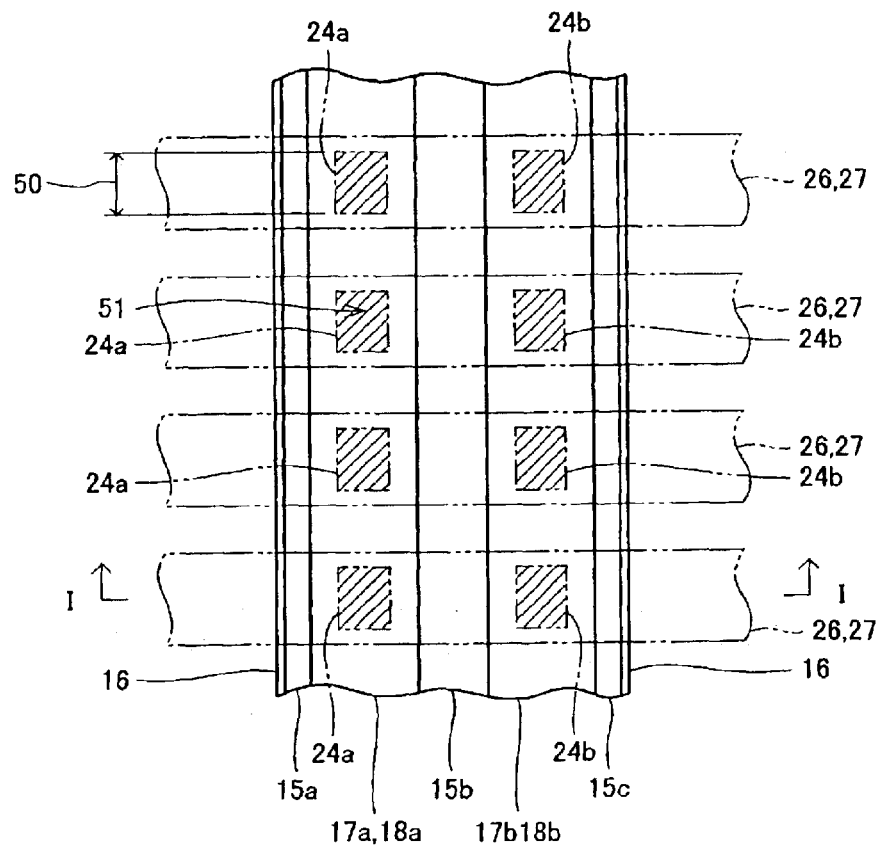
FIG. 2 is a plan view showing the thin film magnetic memory device of FIG. 1.

With reference to FIG. 2, bit lines, making up a plurality, formed of conductor films 27 and barrier metal films 26 extend in one direction at predetermined intervals. The first digit line, formed of conductor film 17a and barrier metal film 18a, as well as the second digit line, formed of conductor film 17b and barrier metal film 18b, extend in the direction perpendicular to the direction in which the bit lines extend in a manner such that the first and second bit lines are separated by a predetermined distance. TMR elements 24a and 24b are arranged in a matrix form at positions wherein the bit lines and the first and second digit lines intersect each other. Magnetic films 16 and 15a to 15c are formed in the direction in which the first and second digit lines extend. Magnetic films 16 and 15a to 15c extend the lengths of sections 50 wherein regions 51, in which TMR elements 24a and 24b as well as the first and second digit lines intersect each other, extend in the same direction that the first and second digit lines extend. Furthermore, magnetic films 16 and 15a to 15c extend over a plurality of sections 50.

With reference to FIGS. 1 and 2, a predetermined memory cell of the MRAM is selected by using a field-effect transistor formed in silicon substrate 1. Then, appropriate currents are made to flow through the above described word line, bit line and digit lines and, thereby, write-in or read-out of data is carried out.

Furthermore, according to a more detailed description, currents are made to flow through predetermined bit line and predetermined digit lines so that a magnetic field is generated in the TMR element provided in the region wherein the bit line and the digit lines intersect each other. Thereby, the direction of magnetization of the ferromagnetic layer forming the magnetic tunnel junction of the TMR element is changed so that the resistance value of the current passing through the TMR element can be altered (tunneling magnetoresistive effect). This tunnel magnetic resistance effect is utilized so that write-in or read-out of data can be carried out.

A thin film magnetic memory device according to a first embodiment of the present invention is provided with: TMR elements 24a and 24b, as first and second magnetic memory cells, that operate as memory elements provided in main surface 1a of silicon substrate 1, as a semiconductor substrate, located at a predetermined distance away from each other; a first digit line, as a first wire, formed of conductor film 17a and barrier metal film 18a, extending in one direction so as to intersect TMR element 24a, for applying a magnetic field to TMR element 24a; a second digit line, as a second wire, formed of conductor film 17b and barrier metal film 18b, extending parallel to the first digit line so as to intersect TMR element 24b, for applying a magnetic field to TMR element 24a; and a magnetic field 15b provided so as to fill in the space between the first digit line and the second digit line and so as to bring into contact with the first and second digit lines. The first and second digit lines are provided between main surface 1a of silicon substrate 1 and TMR elements 24a and 24b.

Magnetic films 16 and 15a to 15c cover the first and second digit lines in a manner wherein only the sides of the first and second digit lines facing TMR elements 24a and 24b are exposed.

Magnetic films 16 and 15a to 15c extend in the direction in which the first and second digit lines extend and magnetic films 16 and 15a to 15c extend, at least, the lengths of sections 50, wherein regions 51 in which TMR elements 24a and 24b as well as the first and second digit lines, respectively, intersect each other, extend in the direction in which the first and second digit lines extend.

Magnetic films 16 and 15a to 15c include an oxide of at least one type of element selected from the group consisting of manganese, zinc and iron.

Figure 27:
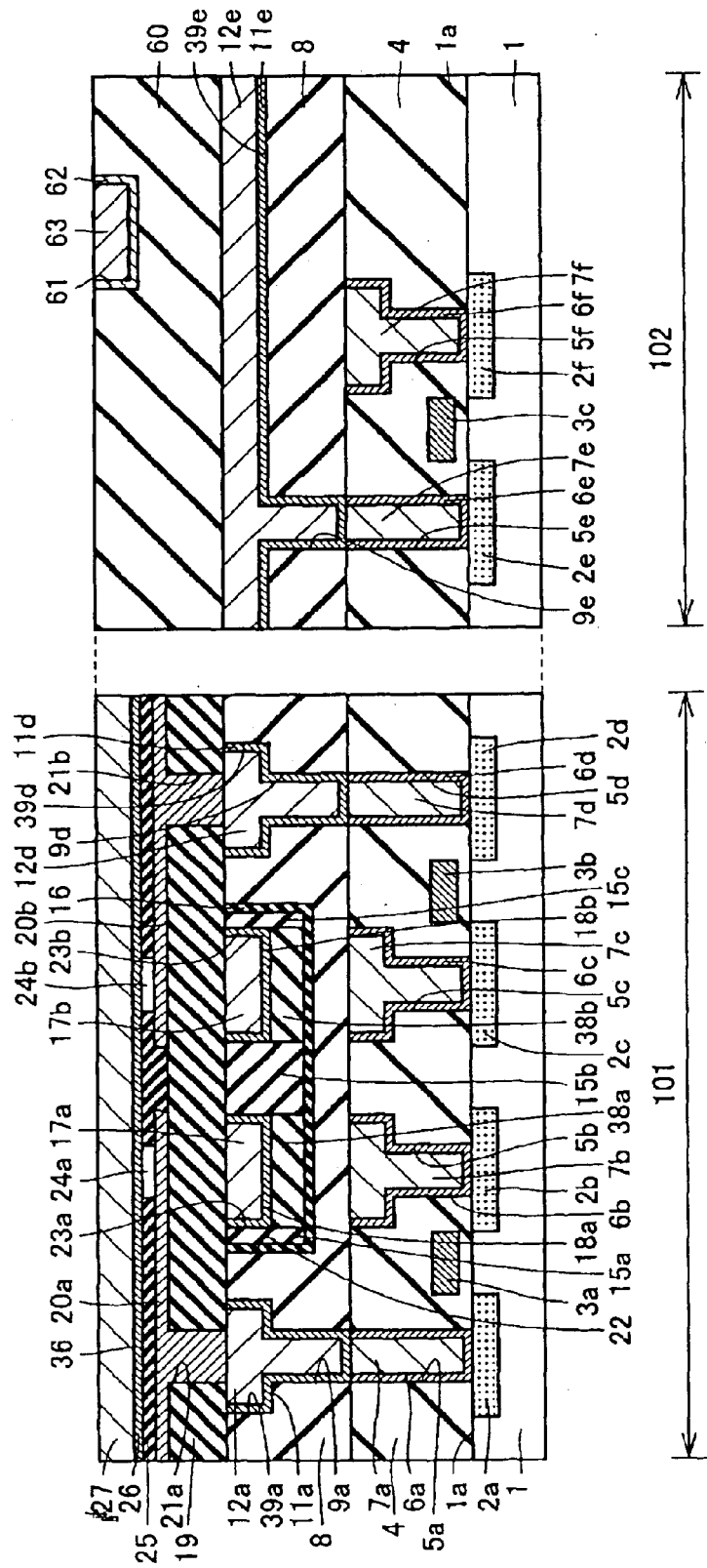

In the following, the structure of a peripheral, or logic, part of the thin film magnetic memory device shown in FIG. 1 is briefly described. FIG. 27 is a cross sectional view showing a step of a manufacturing method for the thin film magnetic memory device shown in FIG. 1. FIG. 27 shows a memory cell region 101 (region shown in the cross sectional view of FIG. 1) of the thin film magnetic memory device and a peripheral, or logic, part 102, other than memory cell region 101. With reference to FIG. 27, memory cell region 101 and peripheral, or logic, part 102 are provided together and the same structures located in the same layer are manufactured at the same time.

With reference to peripheral, or logic, part 102 in FIG. 27, a field-effect transistor forming a peripheral circuit or, logic circuit, is formed. This field-effect transistor is formed of source/drain regions 2e and 2f formed in main surface 1a of silicon substrate 1 and of a gate insulating film, not shown, as well as of a gate electrode 3c formed above silicon substrate 1.

An interlayer insulating film 4 in which contact holes 5e and 5f are formed is provided on silicon substrate 1. Barrier metal films 6e and 6f as well as contact plugs 7e and 7f are formed inside of contact holes 5e and 5f. An interlayer insulating film 8 in which contact hole 9e and trench 39e for a wire are formed is provided on interlayer insulating film 4. A barrier metal film 11e and a contact plug 12e making up a wire in peripheral, or logic, part 102 are formed inside of contact hole 9e and trench 39e for a wire. A magnetic film for covering a wire is not, as described above, formed in peripheral, or logic, part 102.

An interlayer insulating film 60 is formed of a silicon oxide film on interlayer insulating film 8. A trench 61 for a wire is formed in interlayer insulating film 60 from the top surface of interlayer insulating film 60 in the same layer as is trench 36 for a wire in memory cell region 101. A barrier metal film 62 and a conductor film 63 are formed inside of trench 61 for a wire.

A manufacturing method for the thin film magnetic memory device shown in FIG. 1 is described with reference to FIGS. 3 to 28 and FIG. 1. According to the manufacturing process described below, the formation of an interlayer insulating film and a dual damascene process are repeated in sequence and, thereby, wire layers are formed in the respective interlayer insulating films.

Figure 3:
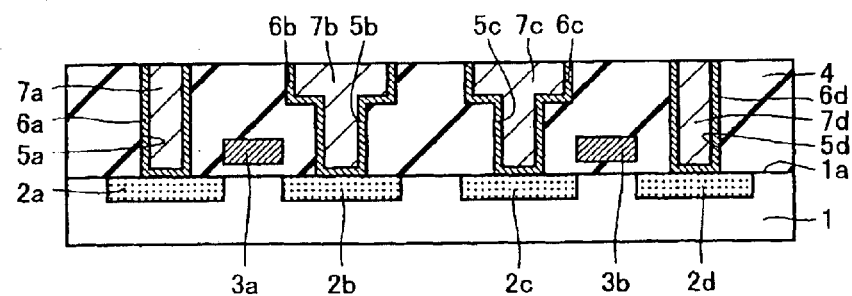
FIGS. 3 to 28 are cross sectional views showing the steps of a manufacturing method for the thin film magnetic memory device shown in FIG. 1.

With reference to FIG. 3, a gate insulating film, not shown, and gate electrodes 3a and 3b patterned into predetermined forms are sequentially formed above main surface 1a of silicon substrate 1. An impurity is implanted into main surface 1a of silicon substrate 1 using gate electrodes 3a and 3b as a mask and, thereby, source/drain regions 2a to 2d are formed.

A silicon oxide film is deposited so as to cover main surface 1a of silicon substrate 1 as well as gate electrodes 3a and 3b and, thereby, interlayer insulating film 4 is formed. A predetermined photolithographic process and an etching process are carried out on interlayer insulating film 4 and, thereby, contact holes 5a to 5d, respectively, that reach to source/drain regions 2a to 2d are formed. A barrier metal and a conductive material are sequentially deposited inside of contact holes 5a to 5d and on the top surface of interlayer insulating film 4. After that, this barrier metal and the conductive material are removed by means of chemical mechanical polishing (CMP) to a level wherein the top surface of interlayer insulating film 4 is exposed and the barrier metal as well as the conductive material are left in contact holes 5a to 5d. Thereby, barrier metal films 6a to 6b as well as contact plugs 7a to 7d are formed inside of contact holes 5a to 5d.

Figure 4:
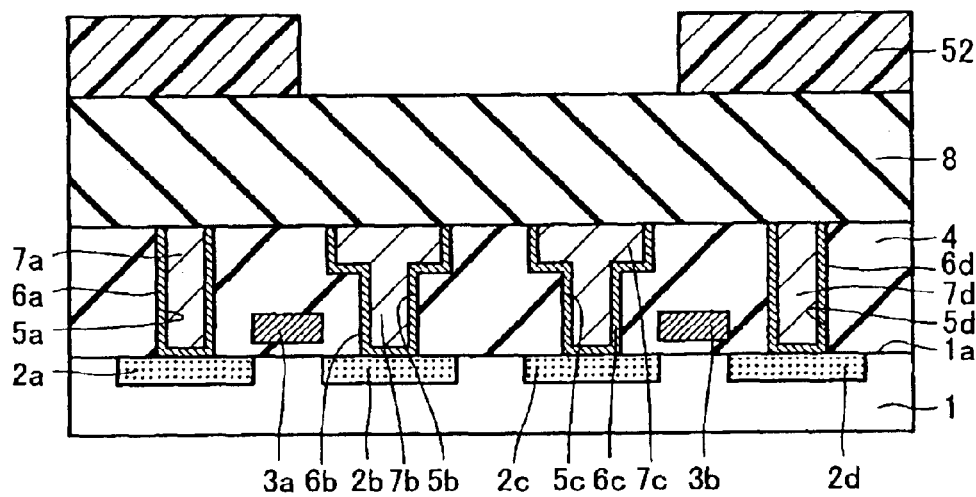

With reference to FIG. 4, interlayer insulating film 8 is formed by depositing a silicon oxide film on interlayer insulating film 4. A resist film 52 having a pattern of openings in a predetermined form is formed on interlayer insulating film 8.

Figure 5:
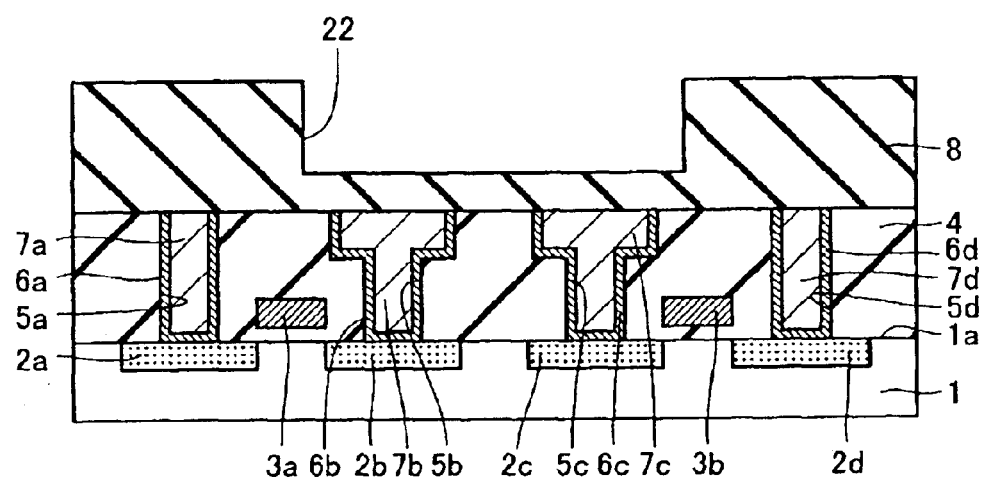

With reference to FIG. 5, trench 22 for shielding is formed by carrying out etching on interlayer insulating film 8 using resist film 52 as a mask. After that, resist film 52 is removed.

Figure 6:
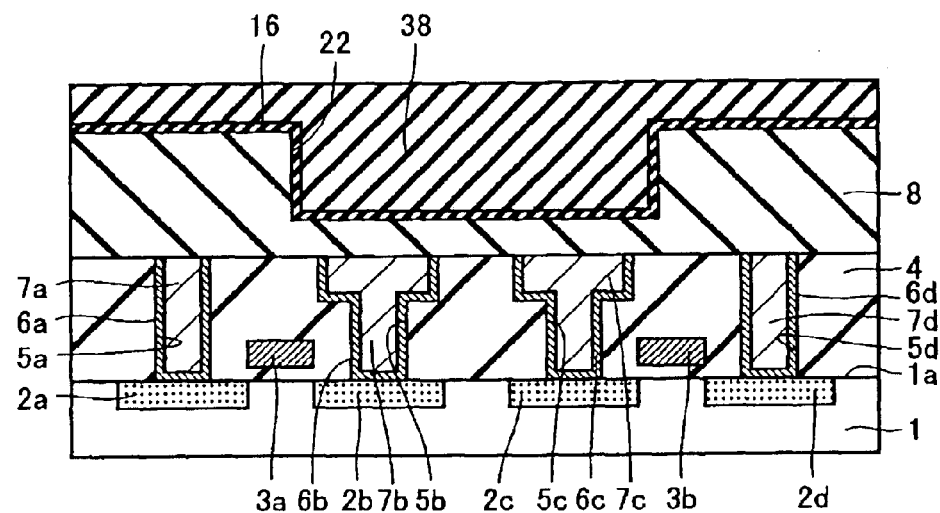
Figure 7:
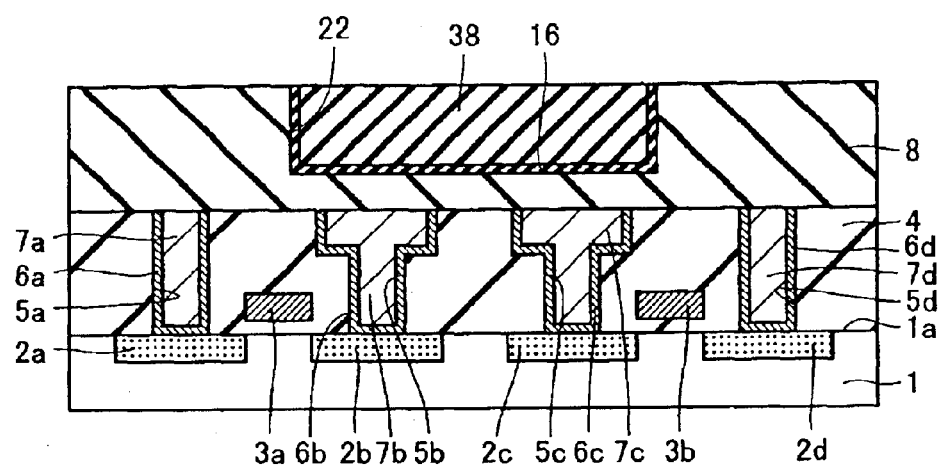

With reference to FIG. 6, a magnetic material is deposited so as to cover the inner walls of trench 22 for shielding and the top surface of interlayer insulating film 8 in order to form magnetic film 16. Subsequently, a silicon oxide film, which becomes insulator film 38, is deposited so as to completely fill in trench 22 for shielding. With reference to FIG. 7, this magnetic material and the silicon oxide film are removed by means of chemical mechanical polishing to a level wherein the top surface of interlayer insulating film 8 is exposed.

Figure 8:
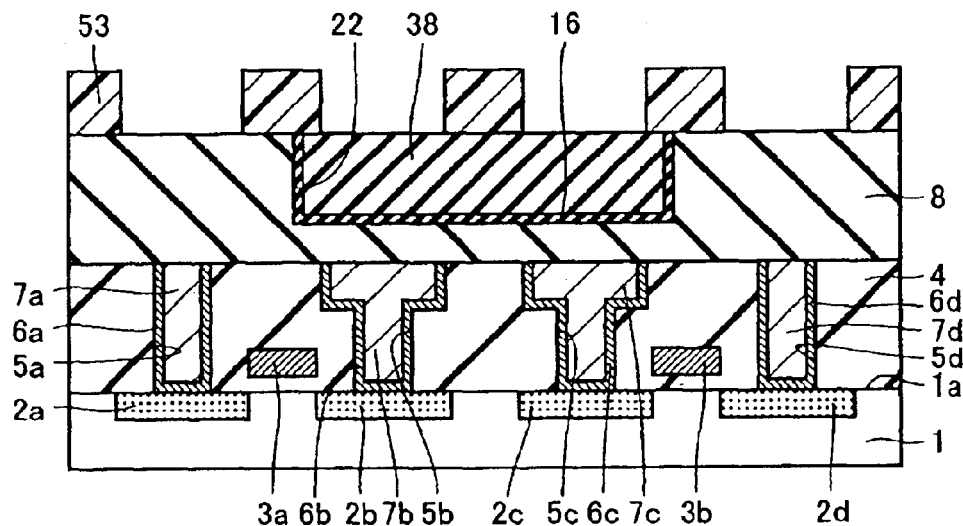
Figure 9:
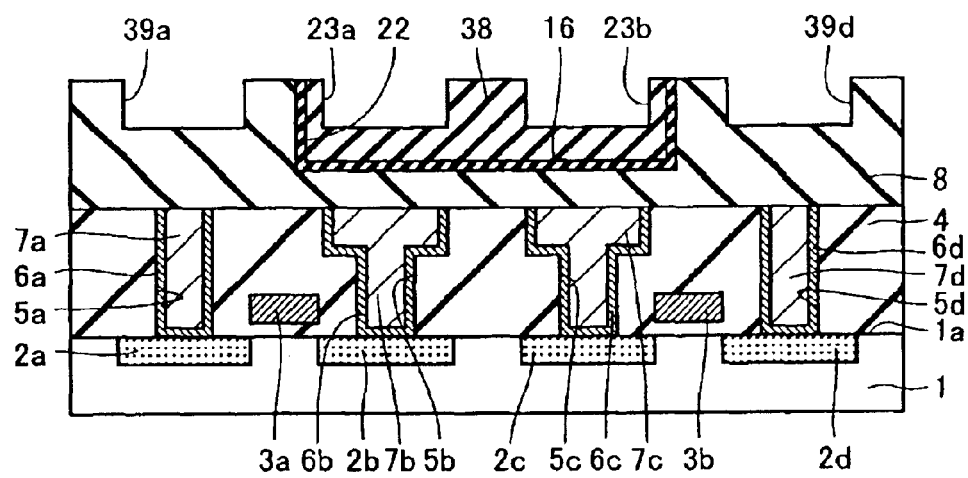

With reference to FIG. 8, a resist film 53 having a pattern of openings in a predetermined form is formed on interlayer insulating film 8. With reference to FIG. 9, etching is carried out on interlayer insulating film 8 and insulator film 38 using resist film 53 as a mask and, thereby, trenches 23a and 23b for wires as well as contact holes 39a and 39d are formed. After that, resist film 53 is removed.

Figure 10:
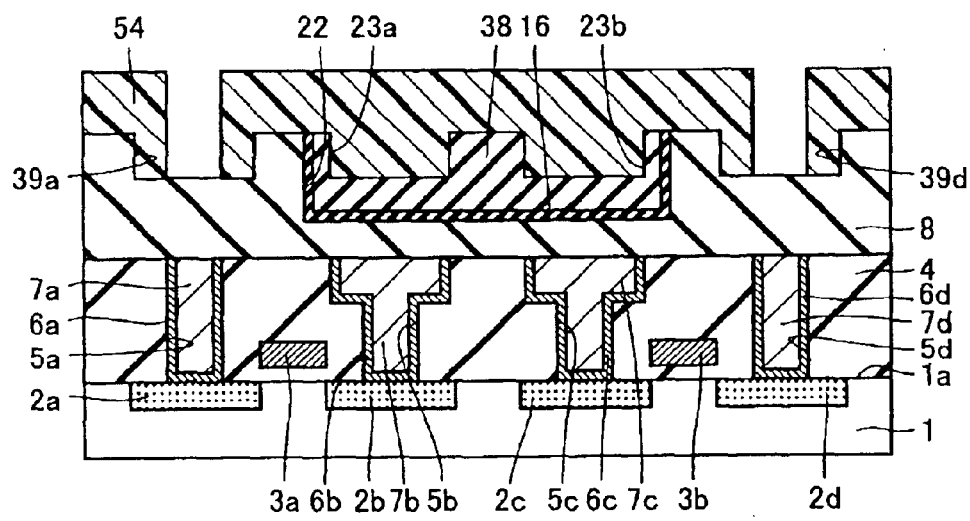
Figure 11:
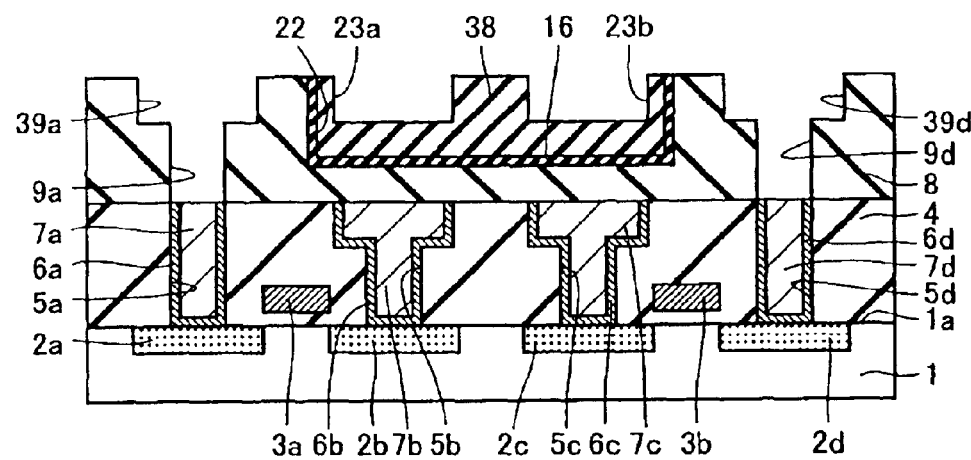

With reference to FIG. 10, a resist film 54 having openings that reach to the bottom of contact holes 39a and 39b is formed on interlayer insulating film 8. With reference to FIG. 11, etching is carried out on interlayer insulating film 8 using resist film 54 as a mask and, thereby, contact holes 9a and 9d are formed. After that, resist film 54 is removed.

Figure 12:
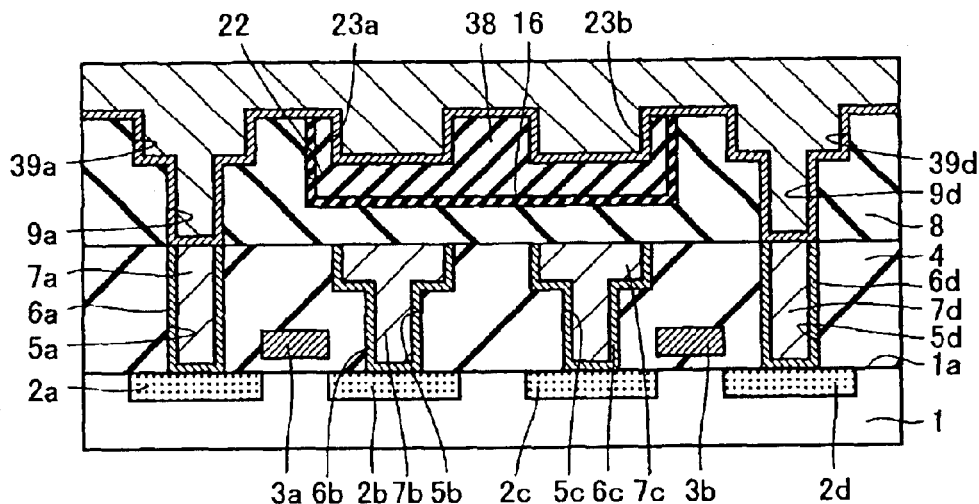
Figure 13:
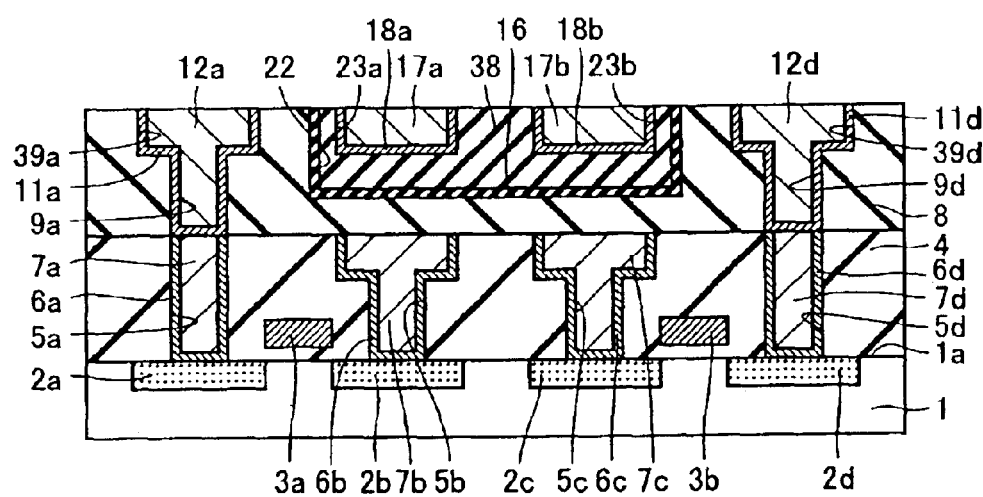

With reference to FIG. 12, a barrier metal and a conductive material are sequentially deposited inside of contact holes 9a and 39a, inside of contact holes 9d and 39d as well as inside of trenches 23a and 23b for wires and on the top surface of interlayer insulating film 8. After that, this barrier metal and the conductive material is removed by chemical mechanical polishing to a level wherein the top surface of interlayer insulating film 8 is exposed and, at the same time, the barrier metal and the conductive material are left in contact holes 9a and 39a, in contact holes 9d and 39d as well as in trenches 23a and 23b for wires. Thereby, barrier metal film 11a and contact plug 12a are formed inside of contact holes 9a and 39a, and barrier metal film 11d and contact plug 12d are formed inside of contact holes 9d and 39d. In addition, barrier metal film 18a and conductor film 17a are formed inside of trench 23a for a wire, and barrier metal film 18b and conductor film 17b are formed inside of trench 23b for a wire.

Figure 14:
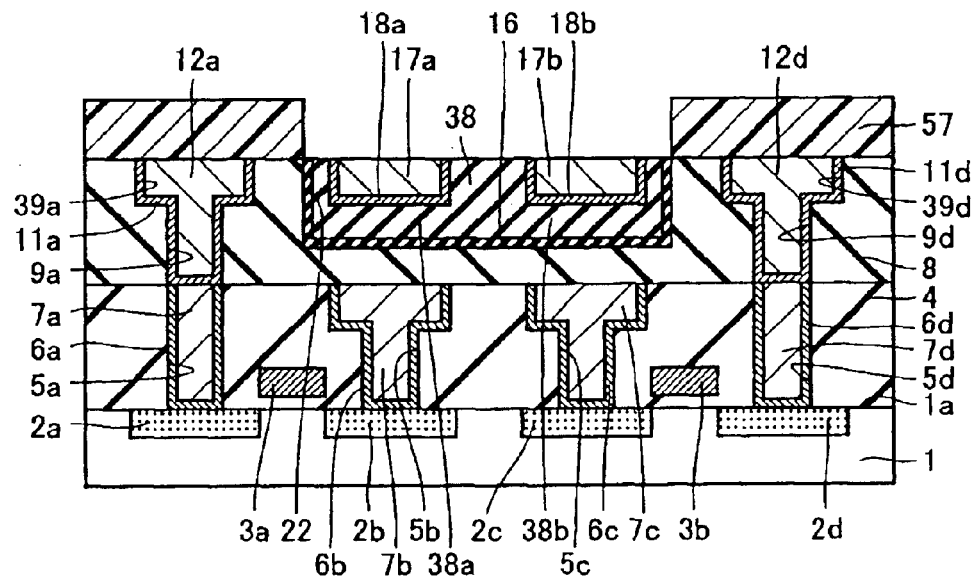
Figure 15:
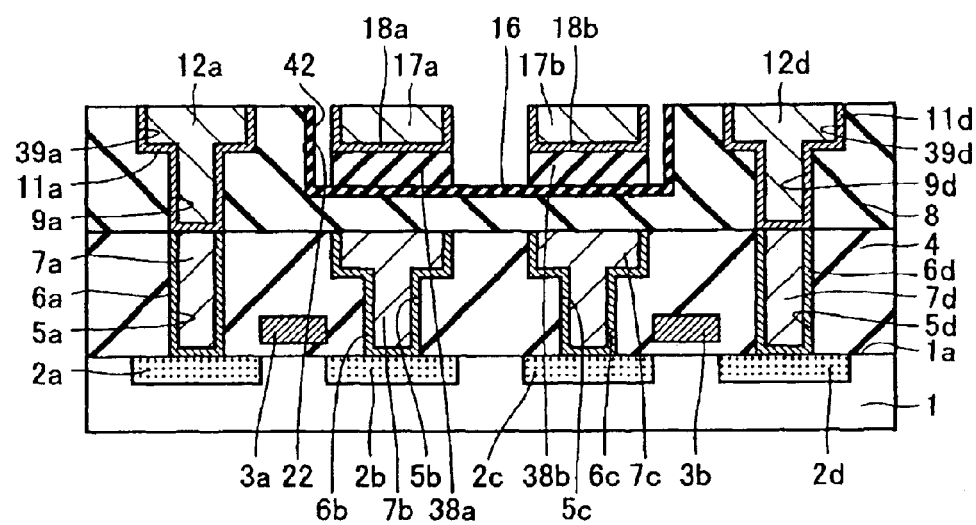

With reference to FIG. 14, a resist film 57 having an opening that exposes trench 22 for shielding is formed on interlayer insulating film 8. With reference to FIG. 15, etching is carried out on insulator film 38 using resist film 57 as a mask. At this time, barrier metal films 18a and 18b as well as conductor films 17a and 17b work as a mask for etching that is carried out on insulator film 38, which is a silicon oxide film. Thereby, insulator film 38 is partially removed and, at the same time, insulator film 38 located beneath barrier metal films 18a and 18b, and beneath conductor films 17a and 17b is left and, thereby, insulator films 38a and 38b are formed inside of trench 42. After that, resist film 57 is removed.

Figure 16:
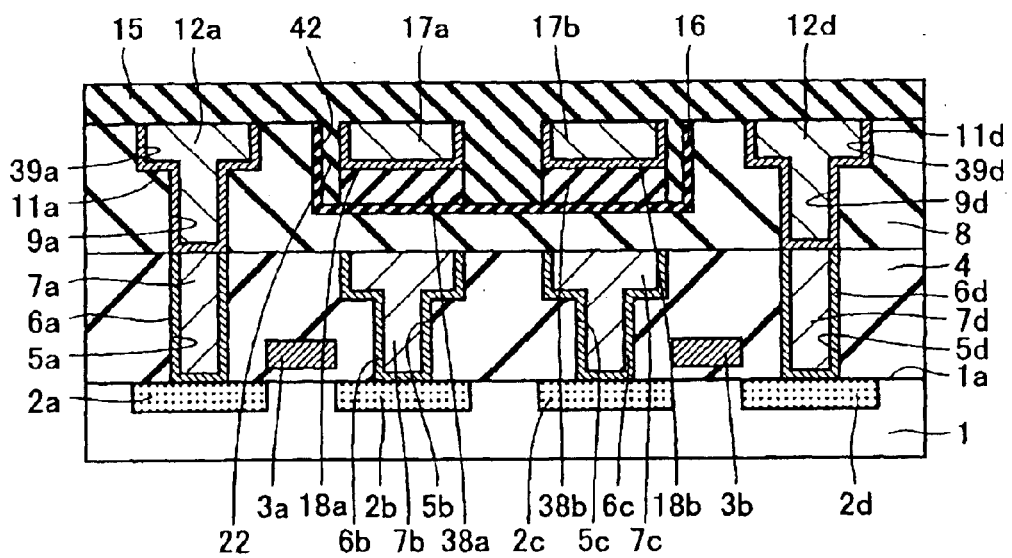
Figure 17:
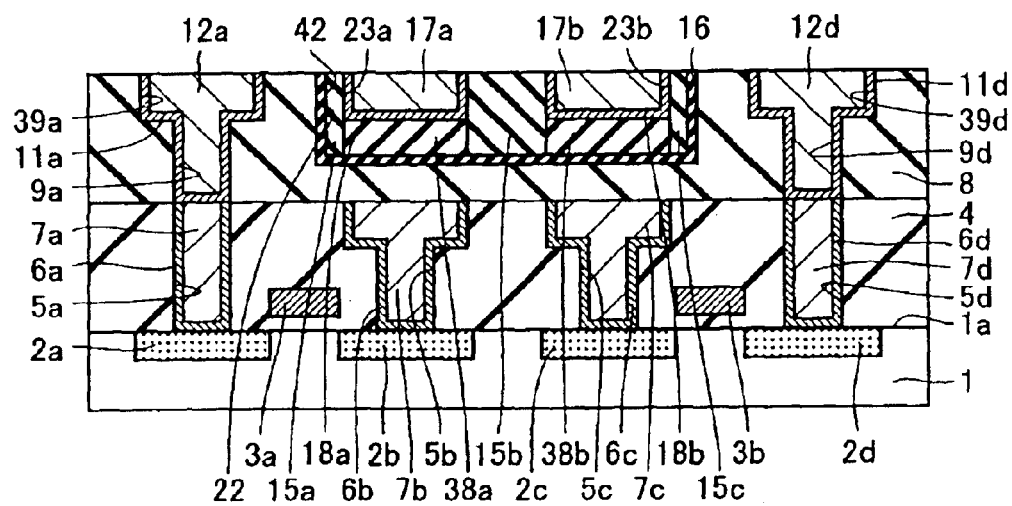

With reference to FIG. 16, magnetic material 15 is deposited so as to fill in the inside of trench 42 and so as to cover the top surface of interlayer insulating film 8. With reference to FIG. 17, this magnetic material 15 is removed by means of chemical mechanical polishing to a level wherein the top surface of interlayer insulating film 8 is exposed and, at the same time, magnetic material 15 is left inside of trench 42 and, thereby, magnetic films 15a to 15c are formed.

Figure 18:
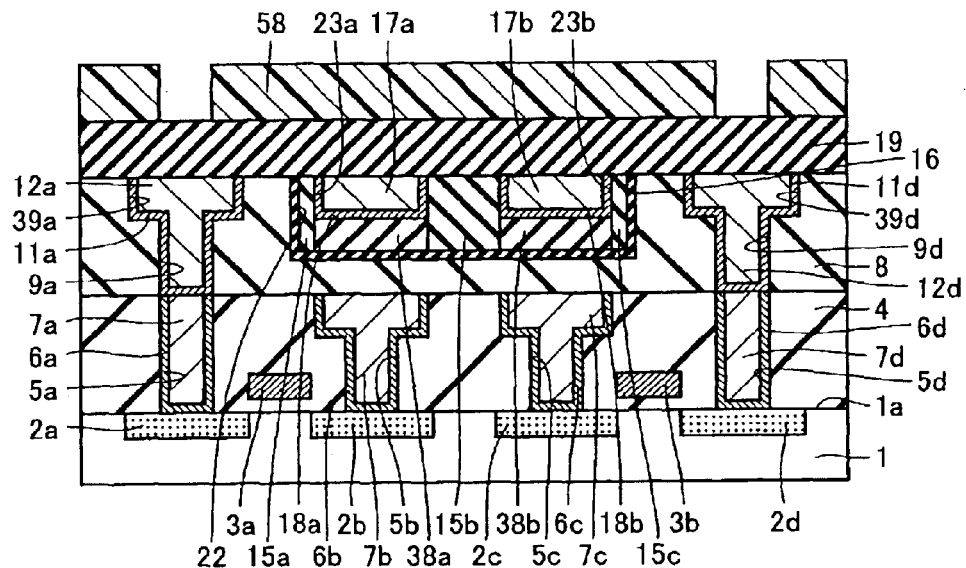

With reference to FIG. 18, interlayer insulating film 19 is formed by depositing a silicon oxide film on interlayer insulating film 8. A resist film 58 having a pattern of openings in a predetermined form is formed on interlayer insulating film 19.

Figure 19:
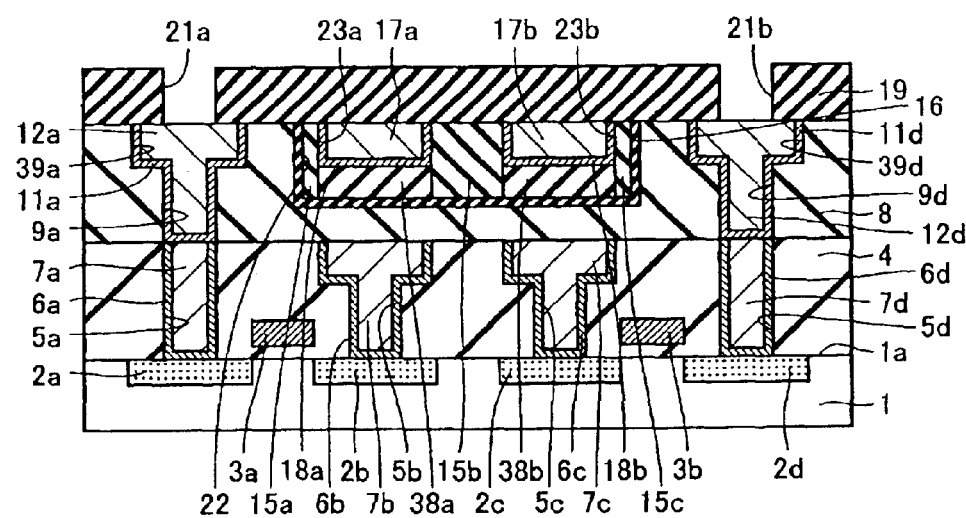

With reference to FIG. 19, etching is carried out on interlayer insulating film 19 using resist film 58 as a mask and, thereby, contact holes 21a and 21b are formed. After that resist film 58 is removed.

Figure 20:
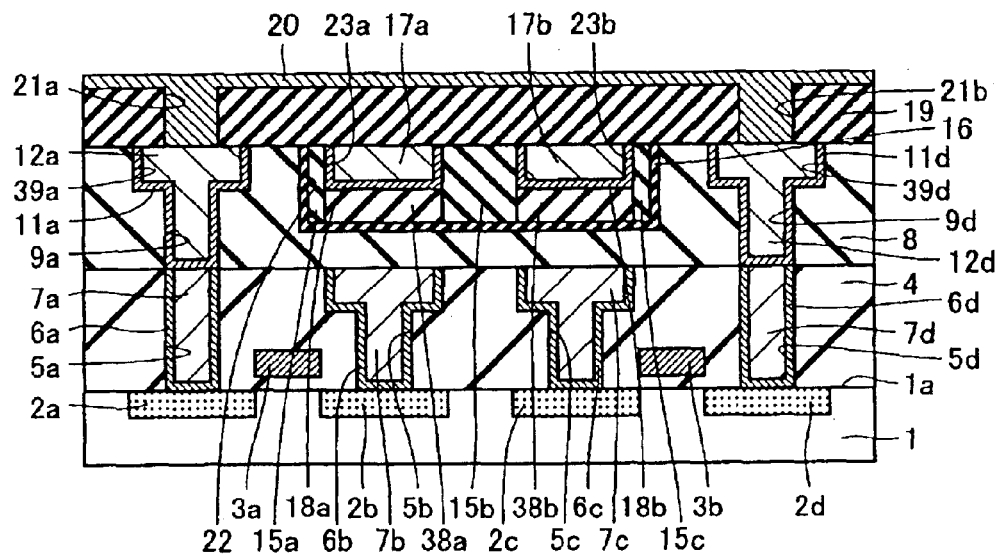
Figure 21:
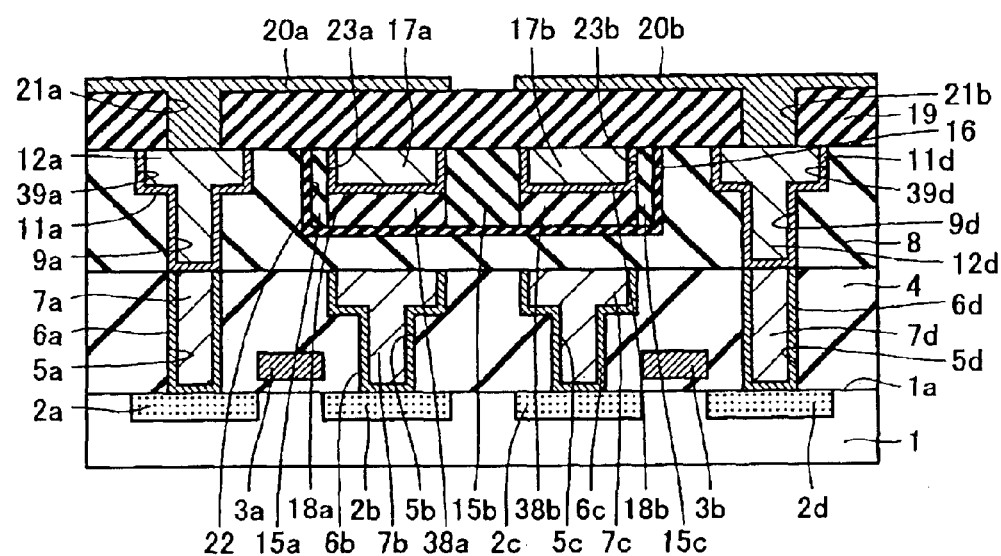

With reference to FIG. 20, conductive material 20 is deposited so as to fill in the insides of contact holes 21a and 21b and so as to cover the top surface of interlayer insulating film 19. With reference to FIG. 21, a predetermined photolithographic process and an etching process are carried out and, thereby, conductive material 20 is patterned so that straps 20a and 20b are formed.

Figure 22:
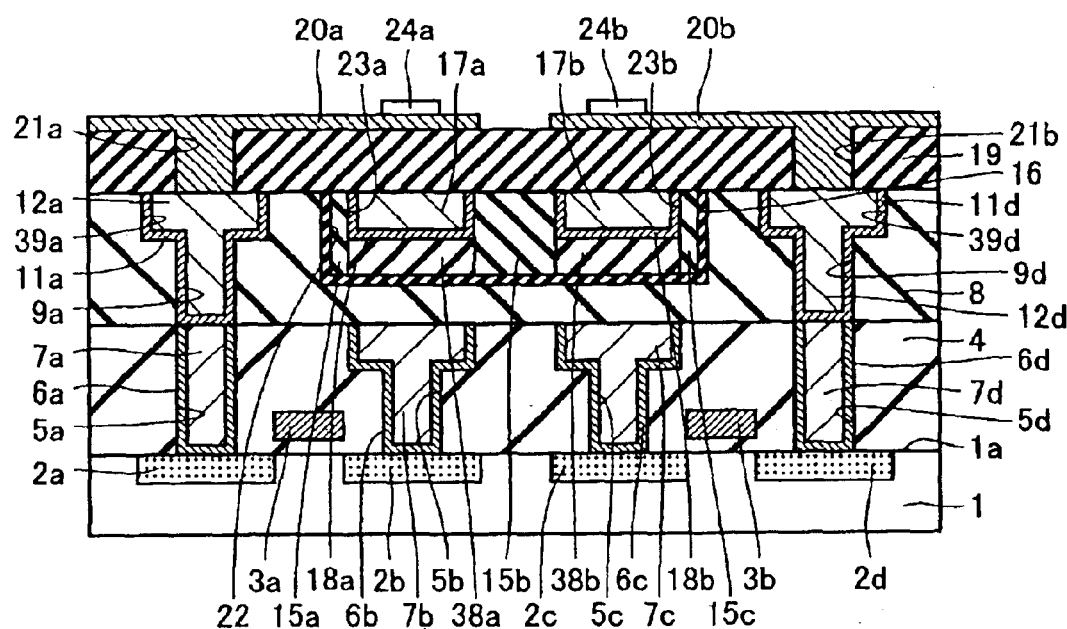

With reference to FIG. 22, TMR elements 24a and 24b having predetermined forms are formed on straps 20a and 20b. At this time, TMR dummy elements may be formed by leaving portions of the layered film for forming TMR elements in peripheral, or logic, part 102 (see FIG. 27), other than in memory cell region 101.

Figure 23:
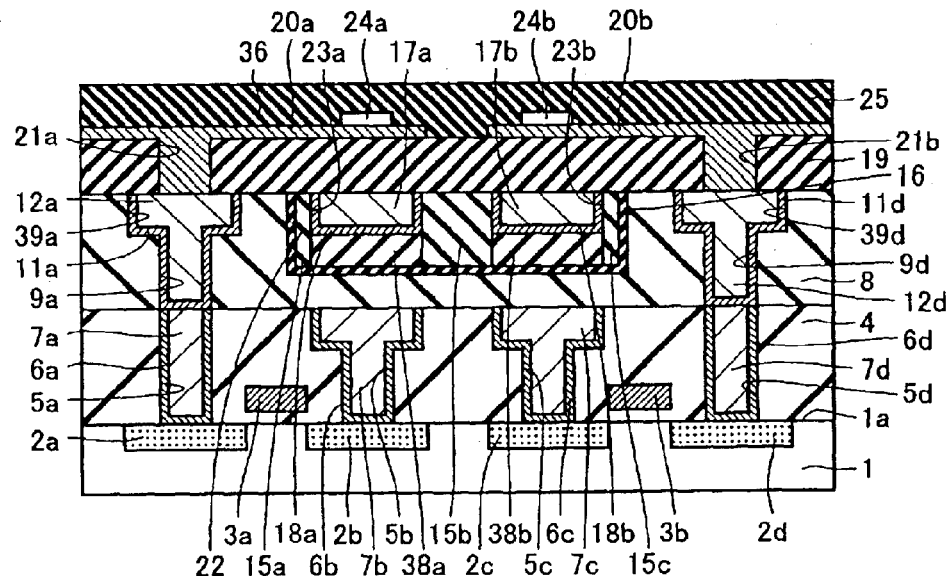

With reference to FIG. 23, a silicon oxide film is deposited so as to cover straps 20a and 20b, TMR elements 24a and 24b as well as the top surface of interlayer insulating film 19 that are exposed from straps 20a and 20b and, thereby, interlayer insulating film 25 is formed.

Figure 24:
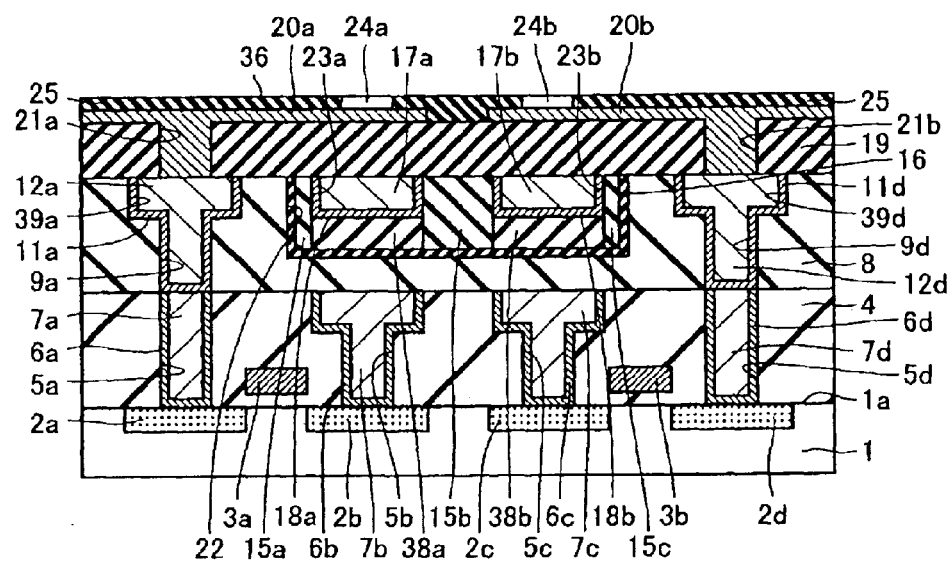

With reference to FIG. 24, interlayer insulating film 25 is removed by means of chemical mechanical polishing to a level wherein the top surfaces of TMR elements 24a and 24b are exposed. At this time the rates of polishing of interlayer insulating film 25 in memory cell region 101 and in peripheral, or logic, part 102 can be made approximately equal in the case where TMR dummy elements are formed in peripheral or logic, part 102 (see FIG. 27), other than in memory cell region 101, in the step shown in FIG. 22. Therefore, the generation of a step between memory cell region 101 and peripheral, or logic, part 102 can be prevented.

Figure 25:
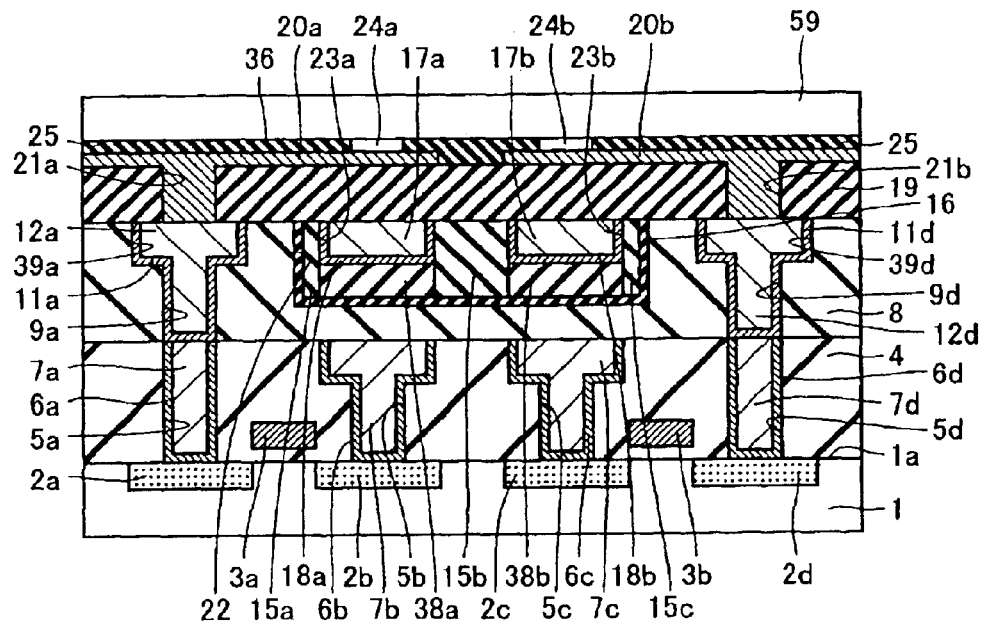
Figure 26:
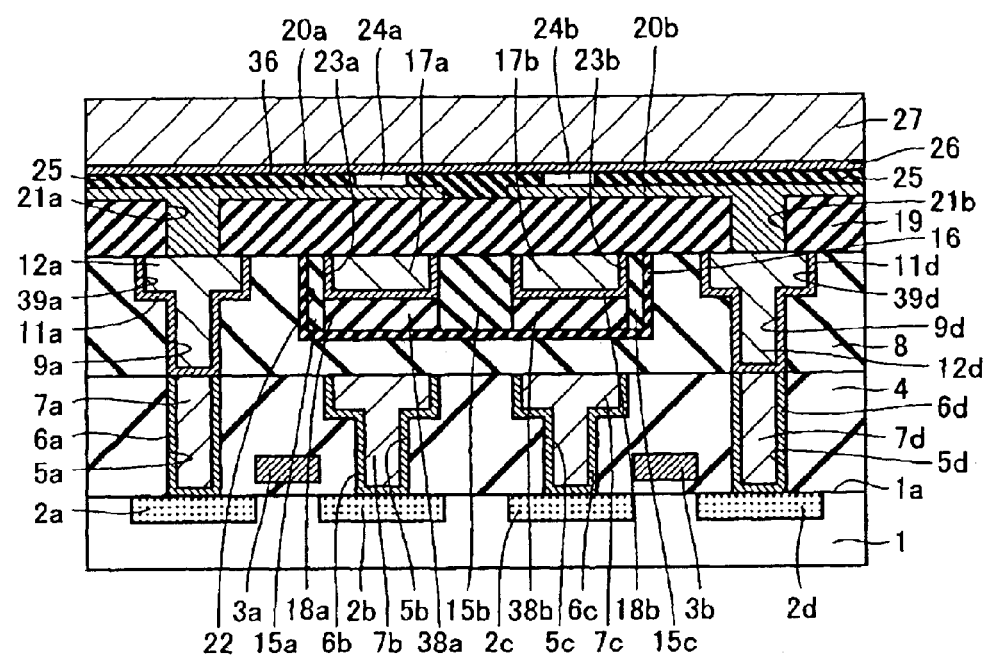

With reference to FIG. 25, interlayer insulating film 59 is formed by depositing a silicon oxide film on interlayer insulating film 25. A predetermined photolithographic process and an etching process are carried out on interlayer insulating film 59 and, thereby, trench 36 for a wire is formed. With reference to FIG. 26, a barrier metal and a conductive material are sequentially deposited inside of trench 36 for a wire and on the top surface of interlayer insulating film 59 in order to form barrier metal film 26 and conductor film 27.

With reference to memory cell region 101 in FIG. 27, the barrier metal and the conductive material are removed to a level wherein the top surface of interlayer insulating film 59 is exposed by means of chemical mechanical polishing and, at the same time, the barrier metal and the conductive material are left in trench 36 for a wire. Thereby, barrier metal film 26 and conductor film 27, making up a bit line, are formed inside of trench 36 for a wire.

Figure 28:
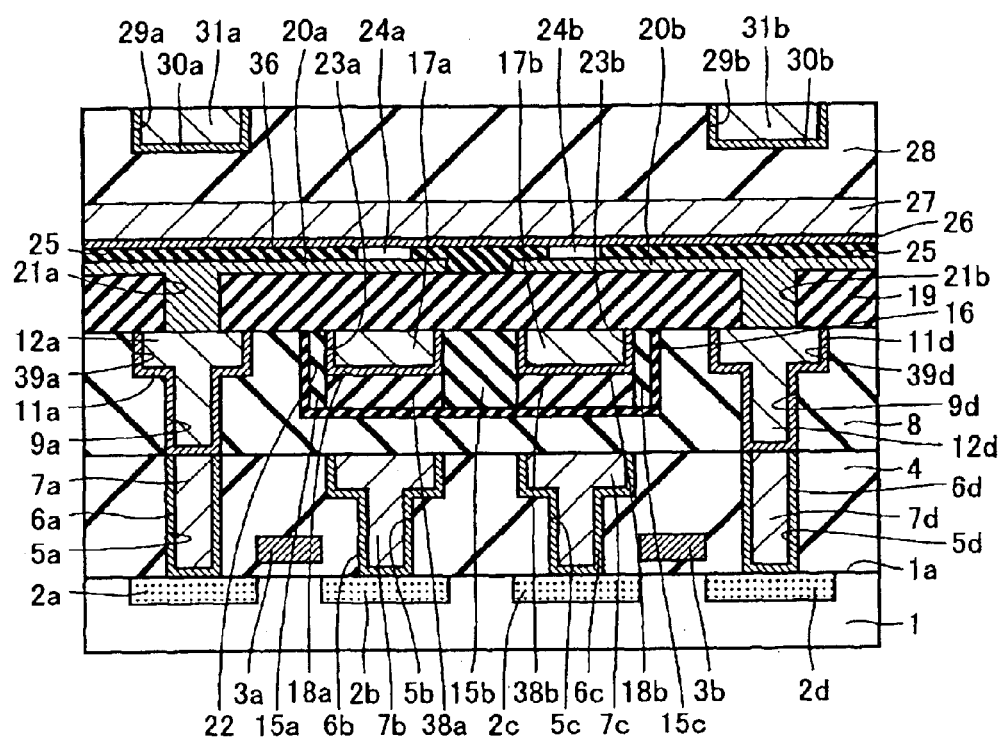

With reference to FIG. 28, interlayer insulating film 28 is formed by depositing a silicon oxide film on interlayer insulating film 59. A predetermined photolithographic process and an etching process are carried out on interlayer insulating film 28 and, thereby, trenches 29a and 29b for wires are formed. After that, barrier metal film 30a and conductor film 31a, as well as barrier metal film 30b and conductor film 31b, making up wires, respectively, are formed inside of trenches 29a and 29b for wires.

With reference to FIG. 1, interlayer insulating film 32 is formed by depositing a silicon oxide film on interlayer insulating film 28. A predetermined photolithographic process and an etching process are carried out on interlayer insulating film 32 and, thereby, trench 35 for a wire is formed. After that, barrier metal film 33 and conductor film 34, making up a wire, are formed inside of trench 35 for a wire. The thin film magnetic memory device shown in FIG. 1 is completed according to the above described process.

Magnetic film 15b is formed between the first digit line, made up of conductor film 17a and barrier metal film 18a, and the second digit line, made up of conductor film 17b and barrier metal film 18b in the thin film magnetic memory device having the above described configuration. In addition, magnetic films 16 and 15a to 15c cover the first and second digit lines, respectively. Therefore, magnetic lines formed around the first and second digit lines due to flow of current are absorbed by the magnetic films. Thereby, the magnetic field that generates due to current flowing through the first digit line can be prevented from affecting TMR element 24b. The magnetic field that generates due to current flowing through the second digit line can be prevented from affecting TMR element 24a in the same manner.

On the other hand, the side of the first digit line facing TMR element 24a and the side of the second digit line facing TMR element 24b are not covered with magnetic films 16 and 15a to 15c. Thereby, a predetermined magnetic field can be applied to TMR element 24a without fail by making current flow through the first digit line and a predetermined magnetic field can be applied to TMR element 24b without fail by making current flow through the second digit line.

Crosstalk between the memory cells provided with TMR elements 24a and 24b, respectively, can be prevented from generating and a magnetic film can be applied to a predetermined TMR element by making current flow through a digit line due to the above described reasons. Thereby, a thin film magnetic memory device having a high reliability can be implemented. Here, it is preferable for the thickness of the magnetic film to be 50 nm, or greater, in order to sufficiently prevent crosstalk between adjacent memory cells from generating.

In addition, insulator film 38 is removed by utilizing, in the step shown in FIG. 15, the first and second digit lines as a mask and, after that, a magnetic material is filled in into the space from which the insulator film has been removed in order to form magnetic film 15 located between the first digit line and the second digit line. This differs from the prior art wherein the wires are covered with a magnetic material and is based on a new idea wherein the interlayer insulating film located between the digit lines is formed of a magnetic material.

The first and second digit lines can be utilized as a mask, as described above, and, therefore, the state wherein the line width of the digit lines becomes small due to constraints in the photolithographic process can be avoided. Thereby, the resistance values of the digit lines can be prevented from increasing and a sufficient amount of current can be made to flow so that the desired magnetic field is generated at a low voltage. In addition, the problem of mask shift at the time of the formation of a magnetic film does not generate and, therefore, a uniform magnetic film of a sufficient thickness can be formed.

In addition, the structure is adopted wherein magnetic films 16 and 15a to 15c are buried throughout the locations where the digit lines are provided and, therefore, the depth at which magnetic films 16 and 15a to 15c are buried can be made sufficiently deep. Thereby, the thicknesses of magnetic films 16 and 15a to 15c can be made sufficiently great in the direction of height. Sufficient magnetic shielding effects as a result of the magnetic films can be obtained due to the above described reasons.

In addition, magnetic films 16 and 15a to 15c are formed in section 50 wherein region 51, in which TMR elements 24a and 24b as well as the first and second digit lines intersect each other, extends in the same direction in which the first and second digit lines extend. Thus, magnetic films 16 and 15a to 15c are provided in region 51, which is the region that is most easily affected by magnetic fields of the digit lines as described above, and, thereby, crosstalk between adjacent memory cells can effectively be prevented. Furthermore, magnetic films 16 and 15a to 15c are provided throughout the entirety of the device in the direction in which the first and second digit lines extend and, therefore, crosstalk between adjacent memory cells can more effectively be prevented.

In addition, the predetermined material forming magnetic films 16 and 15a to 15c is provided with the property of an insulator in addition to that of a magnetic body. The conductor copper, for example, has a specific electrical resistance of $1.55 \times 10^5$ ($\mu\Omega \cdot cm$), and a comparison of this specific electrical resistance of copper and the specific electrical resistance of the material forming magnetic films 16 and 15a to 15c shows an order of difference of from 3 to 7 digits. Therefore, currents flowing through the first and second digit lines can be prevented from flowing out to magnetic films 15a to 15c.

Second Embodiment

Figure 29:
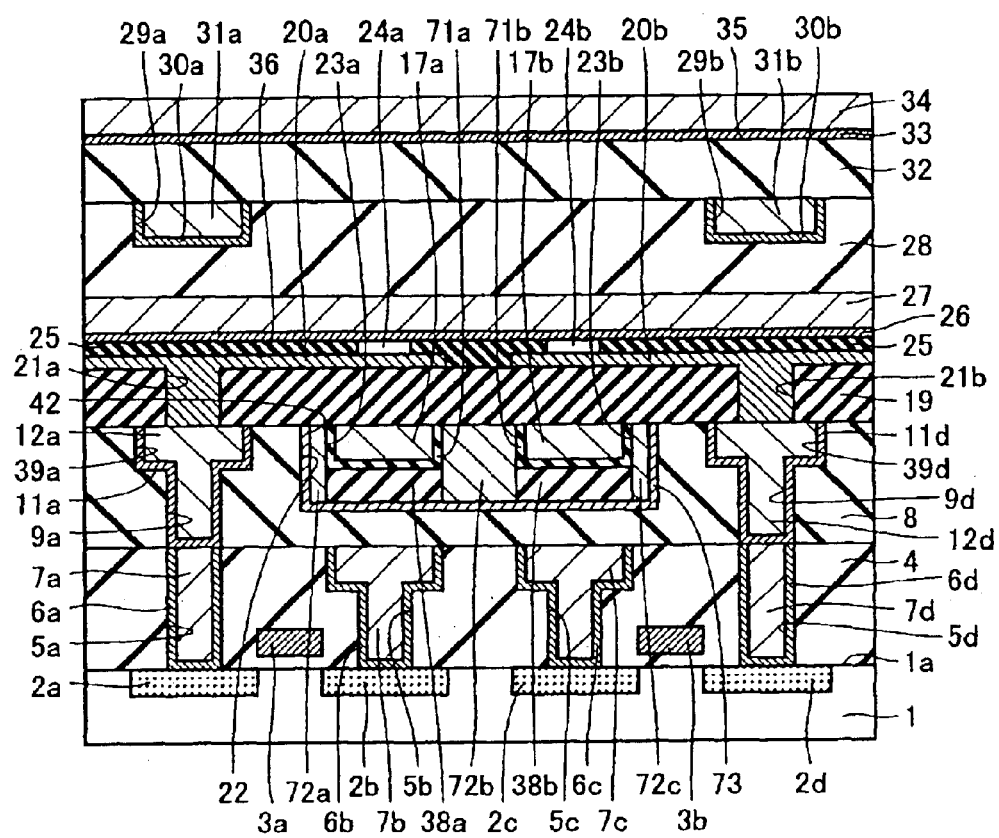
FIG. 29 is a cross sectional view showing a thin film magnetic memory device according to a second embodiment of the present invention.

With reference to FIG. 29, the thin film magnetic memory device according to a second embodiment has the same form as that of the thin film magnetic memory device according to the first embodiment shown in FIG. 1 and the portions covering the conductor films forming digit lines are made of a material different from that of the thin film magnetic memory device according to the first embodiment. In the following, descriptions of the parts of the structure that are the same as of the thin film magnetic memory device according to the first embodiment will not be repeated.

Insulator films 71a and 71b, respectively, are formed of silicon nitride films, for example, so as to cover the walls of conductor films 17a and 17b, except for the top surfaces of conductor films 17a and 17b. Magnetic films 72a to 72c formed so as to bring into contact with the sidewalls of insulator films 71a and 71b, as well as a magnetic film 73 formed along the inner walls of trench 22 for shielding, are formed of a magnetic material of cobalt (Co)-iron (Fe) alloy or of nickel (Ni)-iron (Fe) alloy. First and second digit lines in memory cells of the MRAM are formed of conductor films 17a and 17b.

Insulator films 71a and 71b, shown in FIG. 29, are provided in the locations wherein barrier metal films 18a and 18b, shown in FIG. 1, are formed. Magnetic films 72a, 72b, 72c and 73, shown in FIG. 29, are provided at locations wherein magnetic films 15a, 15b, 15c and 16, shown in FIG. 1, are formed.

The thin film magnetic memory device according to the second embodiment of the present invention is provided with: TMR elements 24a and 24b as first and second magnetic memory cells provided in main surface 1a of silicon substrate 1, as a semiconductor substrate, at a predetermined distance away from each other so as to operate as memory elements; a first digit line formed of conductor film 17a, as a first wire, for applying a magnetic field to TMR element 24a extending in one direction so as to intersect TMR element 24a; a second digit line formed of conductor film 17b, as a second wire, for applying a magnetic field to TMR element 24b extending parallel to the first digit line so as to intersect TMR element 24b; a magnetic film 72b that fills in the space between the first digit line and the second digit line; and insulator films 71a and 71b, interposed between the first digit line and magnetic film 72b as well as between the second digit line and magnetic film 72b, respectively. The first and second digit lines are provided between main surface 1a of silicon substrate 1 and TMR elements 24a and 24b.

Magnetic films 73 and 72a to 72c cover the first and second digit lines so that only the sides of the first and second digit lines facing TMR elements 24a and 24b are exposed.

Magnetic films 73 and 72a to 72c extend in the direction in which the first and second digit lines extend and magnetic films 73 and 72a to 72c extend, at least, the lengths of the sections wherein regions in which TMR elements 24a and 24b as well as the first and second digit lines, respectively, intersect each other extend in the direction in which the first and second digit lines extend.

Magnetic films 73 and 72a to 72c include at least one of an alloy of cobalt-iron or an alloy of nickel-iron.

Insulator films 71a and 71b serve as protective films for the first and second digit lines formed of conductor films 17a and 17b in the thin film magnetic memory device having the above described configuration. Insulator films 71a and 71b maintain insulation between the first and second digit lines and, therefore, it is not necessary to form magnetic films 72a to 72c of a magnetic material that has insulating properties. Therefore, freedom of selection of the magnetic material that forms magnetic films 72a to 72c is increased. Thus, the same effects as the effects described in the first embodiment can be obtained according to the thin film magnetic memory device the above described configuration.

Third Embodiment

Figure 30:
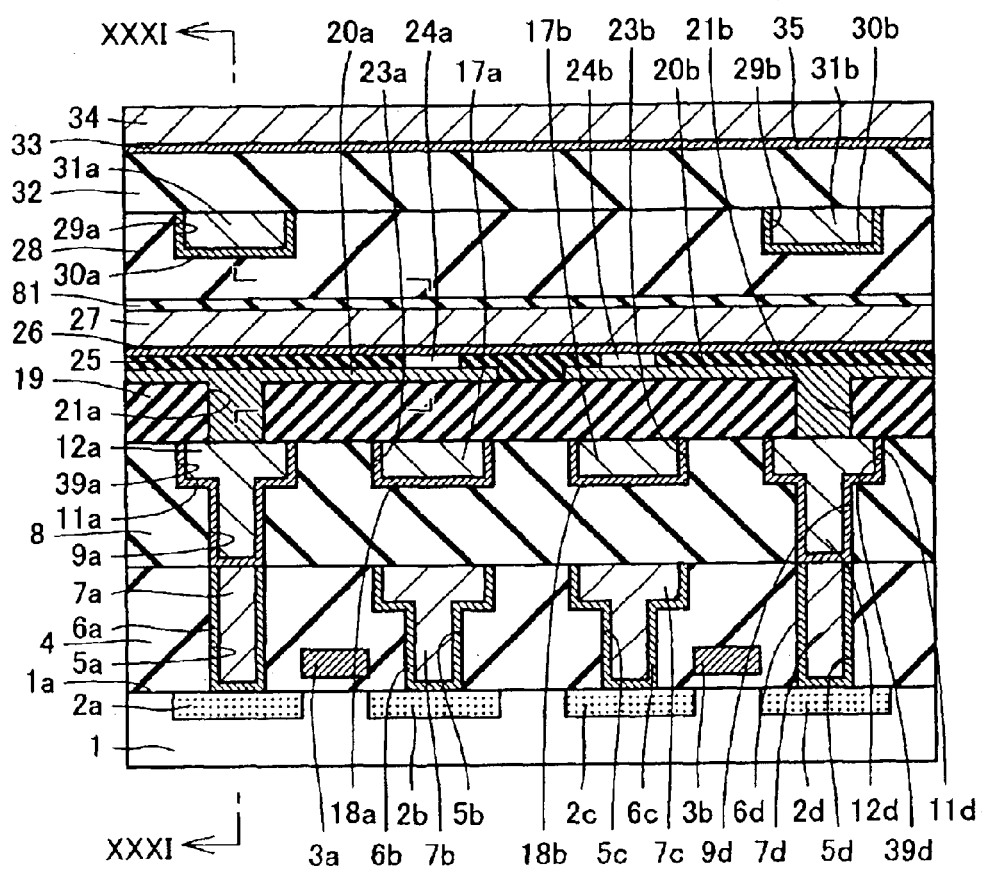
FIG. 30 is a cross sectional view showing a thin film magnetic memory device according to a third embodiment of the present invention.

FIG. 30 shows a memory cell region of the thin film magnetic memory device according to a third embodiment. With reference to FIG. 30, the thin film magnetic memory device has a layer structure, which differs from that of the thin film magnetic memory device according to the first embodiment shown in FIG. 1, wherein interlayer insulating film 8 and a bit line are formed. The descriptions of the parts of the structure that are the same as in the thin film magnetic memory device according to the first embodiment will not be repeated.

With reference to FIG. 30, trenches 23a and 23b for wires extending in the direction perpendicular to the surface of the paper of FIG. 30 are formed in interlayer insulating film 8 from the top surface of interlayer insulating film 8. First and second digit lines, made up of conductor film 17a and barrier metal film 18a as well as of conductor film 17b and barrier metal film 18b, respectively, are formed inside of trenches 23a and 23b for wires. Magnetic films for covering the first and second digit lines are not provided in the thin film magnetic memory device according to the third embodiment.

Figure 31:
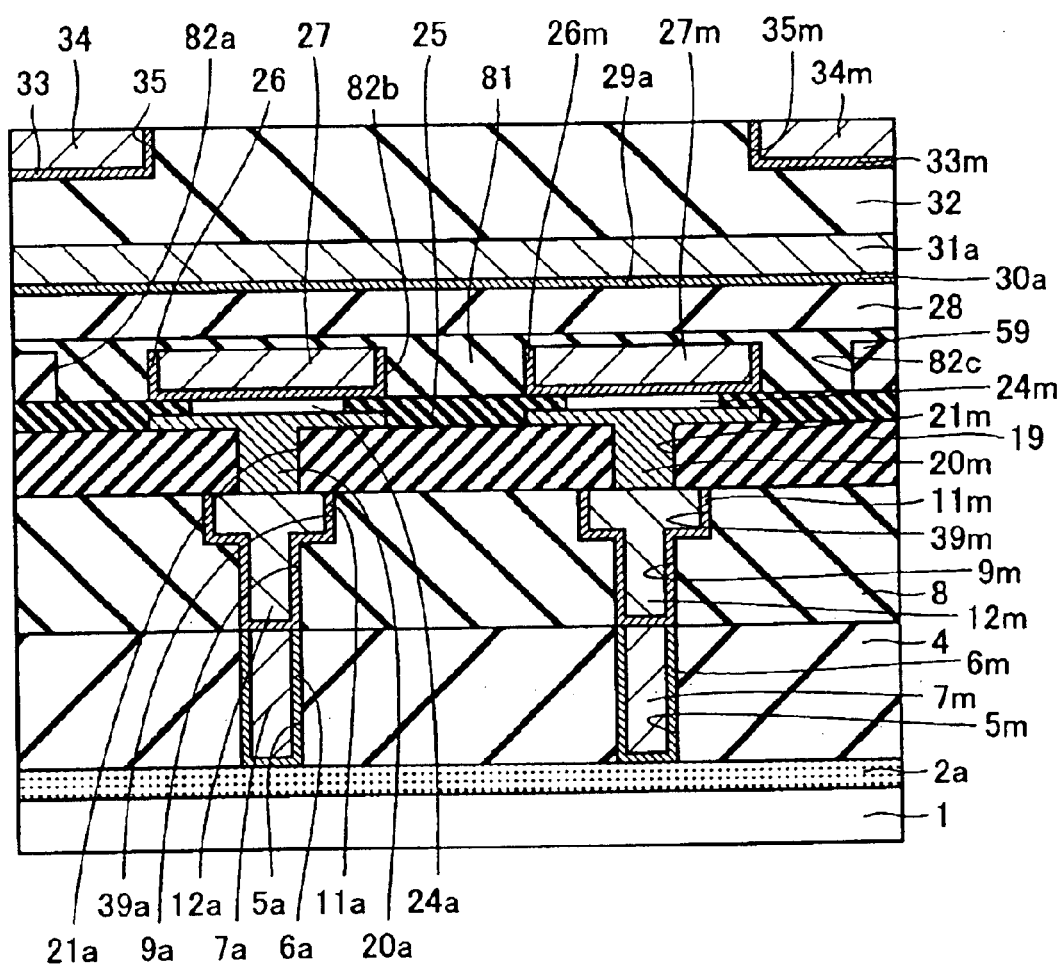
FIG. 31 is a cross sectional view showing the thin film magnetic memory device taken along line XXXI—XXXI of FIG. 30.

With reference to FIG. 31, a second memory cell of the MRAM formed to have a TMR element 24m as a magnetic memory is provided adjacent to a first memory cell of the MRAM formed to have a TMR element 24a as a magnetic memory cell.

Furthermore, according to a more detailed description, this second memory cell of the MRAM is formed of: a field-effect transistor formed in silicon substrate 1; a strap 20m electrically connected to the field-effect transistor; TMR element 24m formed so as to bring into contact with the top surface of strap 20m; a first digit line (see FIG. 30) formed of conductor film 17a and barrier metal film 18a extending beneath TMR element 24m; and a second bit line formed of a conductor film 27m and a barrier metal film 26m extending above TMR element 24m. Hereinafter the bit line formed of conductor film 27 and barrier metal film 26 is referred to as first bit line.

A contact hole 5m that reaches to source/drain region 2a is formed in interlayer insulating film 4 and a contact hole 9m that reaches to the top surface of interlayer insulating film 4 and a contact hole 39m that continues to contact hole 9m are formed in interlayer insulating film 8. Barrier metal films 6m and 11m as well as contact plugs 7m and 12m formed inside of these contact holes make an electrical connection between the field-effect transistor and strap 20m.

A trench 82a for shielding whose sidewalls are defined by interlayer insulating film 59 and by barrier metal film 26 and whose bottom is defined by interlayer insulating film 25 is formed in interlayer insulating film 59 formed on interlayer insulating film 25. A trench 82b for shielding whose sidewalls are defined by barrier metal films 26 and 26m and whose bottom is defined by interlayer insulating film 25 is formed in interlayer insulating film 59. A trench 82c for shielding whose sidewalls are defined by interlayer insulating film 59 and by barrier metal film 26m and whose bottom is defined by interlayer insulating film 25 is formed in interlayer insulating film 59.

A magnetic film 81 is formed so as to fill in the insides of trenches 82a to 82c for shielding and so as to cover the first and second bit lines as well as the top surface of interlayer insulating film 59. Magnetic film 81 is formed of a magnetic material made of an oxide of manganese, zinc or iron.

The sidewalls of the first and second bit lines bring into contact with magnetic film 81 on the sides wherein the first and second bit lines face each other. Magnetic film 81 fills in the space between the first bit line and the second bit line. The distance between main surface 1a of silicon substrate 1 and the top surface of magnetic film 81 is greater than the distance between main surface 1a of silicon substrate 1 and the top surfaces of the first and second bit lines. The bottom surfaces of the first and second bit lines bring into contact with TMR elements 24a and 24m. Magnetic film 81 covers the first and second bit lines so that only the bottom surfaces of the first and second bit lines are exposed.

A trench 35m for a wire is formed in interlayer insulating film 32 so as to be in parallel to trench 35 for a wire. A barrier metal film 33m and a conductor film 34, which become a wire, are formed inside of trench 35m for a wire.

The first bit line formed of conductor film 27 and barrier metal film 26 as well as the second bit line formed of conductor film 27m and barrier metal film 26m, as first and second wires, are provided so that TMR elements 24a and 24m, as first and second magnetic memory cells, are located between main surface 1a of silicon substrate 1 and the first and second bit lines in the thin film magnetic memory device according to the third embodiment of the present invention.

With reference to FIGS. 32 to 35 and FIG. 31, the portion of a manufacturing method for the thin film magnetic memory device shown in FIG. 31, which follows the step of forming the first and second bit lines, is described.

Figure 32:
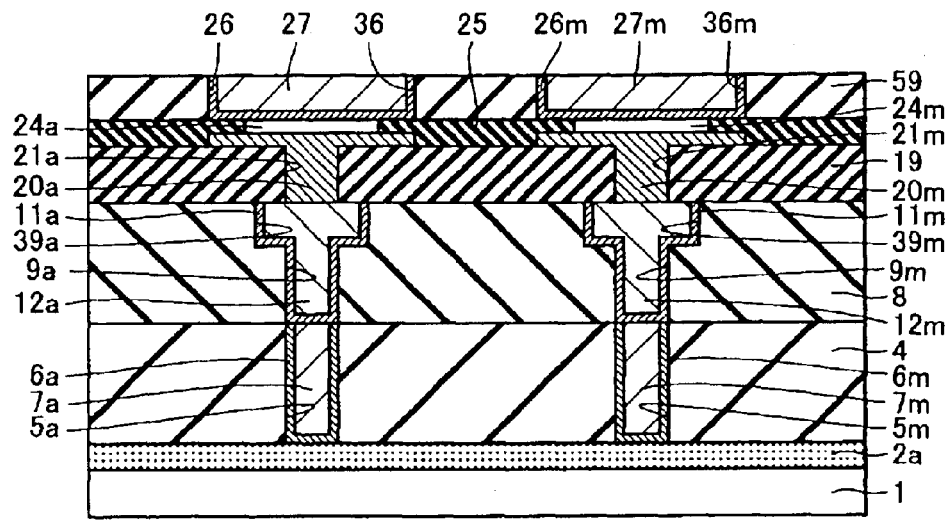
FIGS. 32 to 35 are cross sectional views showing the steps of a manufacturing method for the thin film magnetic memory device shown in FIG. 31.

With reference to FIG. 32, the barrier metal and the conductive material are removed by means of chemical mechanical polishing up to a level wherein the top surface of interlayer insulating film 59 is exposed and, at the same time, the barrier metal and the conductive material are left in trenches 36 and 36m for wires. Thereby, barrier metal film 26 and conductor film 27 forming the first bit line as well as barrier metal film 26m and conductor film 27m forming the second bit line, respectively, are provided inside of trenches 36 and 36m for wires.

Figure 33:
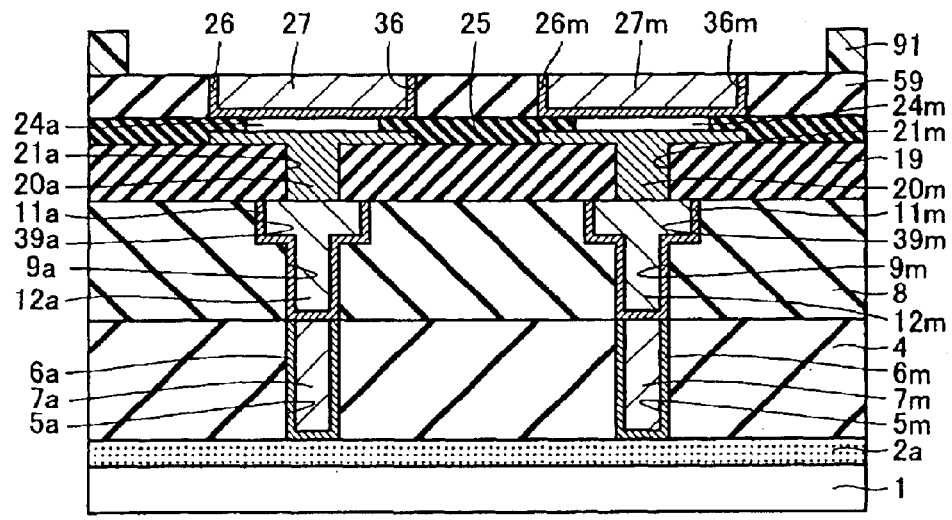

With reference to FIG. 33, a resist film 91 having openings for exposing the top surfaces of the first and second bit lines, the top surfaces of interlayer insulating film 25 located on both sides of the first and second bit lines and the top surface of interlayer insulating film 25 located between the first and the second bit lines is formed on interlayer insulating film 59.

Figure 34:
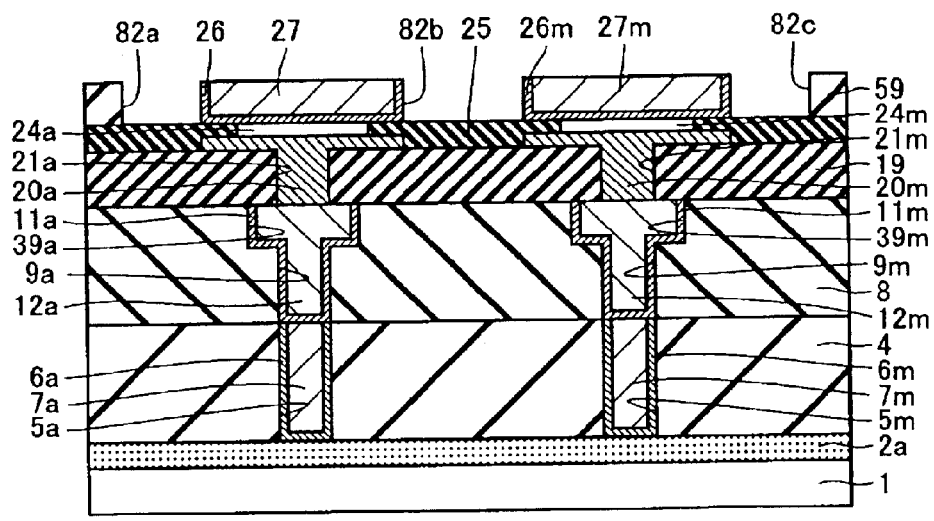

With reference to FIG. 34, etching is carried out on interlayer insulating film 59 using resist film 91 as a mask and, thereby, trenches 82a to 82c for shielding are formed. At this time, conductor films 27 and 27m as well as barrier metal films 26 and 26m act as a mask for etching that is carried out on interlayer insulating film 59, which is a silicon oxide film. After that resist film 91 is removed.

Figure 35:
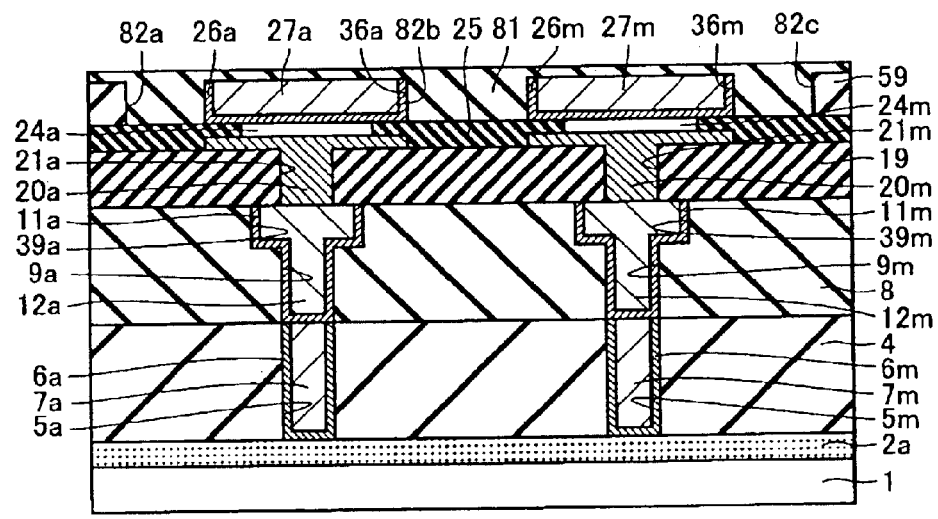

With reference to FIG. 35, a magnetic material is deposited so as to fill in the insides of trenches 82a to 82c for shielding and so as to cover the top surfaces of interlayer insulating film 59 as well as of the first and second bit lines and, thereby, magnetic film 81 is formed.

With reference to FIG. 31, the formation of an interlayer insulating film and a dual damascene process are repeated in sequence and, thereby, interlayer insulating film 28, wherein is provided the wire made up of barrier metal film 30a and conductor film 31a, and interlayer insulating film 32, wherein are provided the wires made up of barrier metal films 33 and 33m as well as conductor films 34 and 34m, are formed.

The same effects as the effects described in the first embodiment concerning crosstalk which generates due to currents flowing through the first and second bit lines can be obtained according to the thin film magnetic memory device having the above described configuration. Thereby, a thin film magnetic memory device having a high reliability can be implemented. Here, it is preferable, in the same manner as in the first embodiment, for the thickness of the magnetic film to be 50 nm, or greater, in order to sufficiently prevent crosstalk between adjacent memory cells from generating.

Fourth Embodiment

Figure 36:
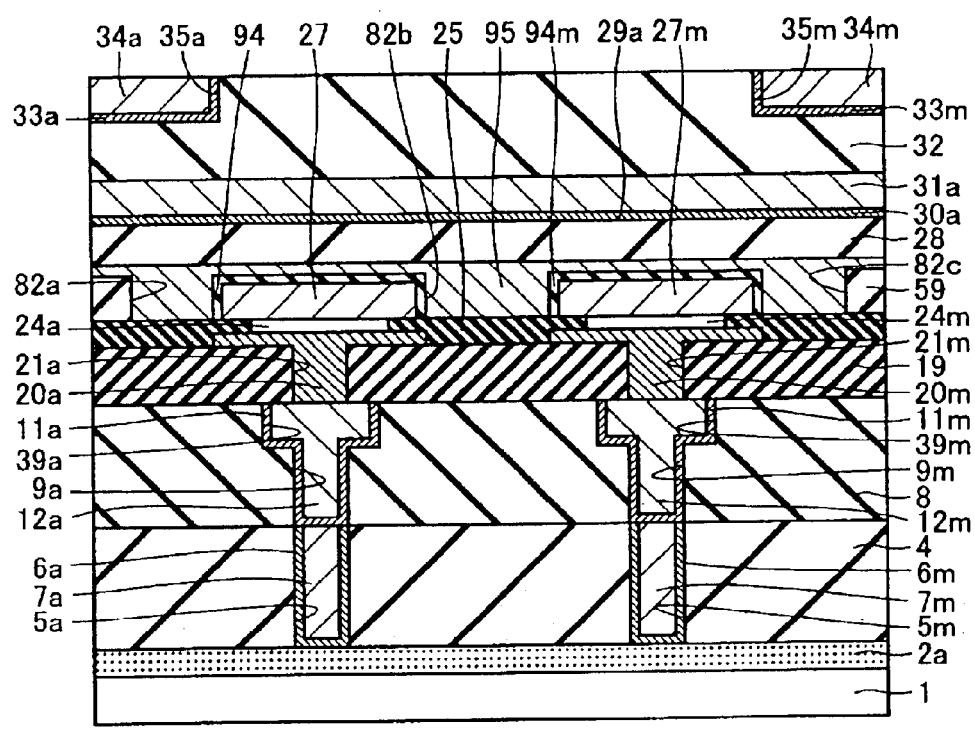
FIG. 36 is a cross sectional view showing a thin film magnetic memory device according to a fourth embodiment of the present invention.

With reference to FIG. 36, the thin film magnetic memory device according to a fourth embodiment has approximately the same form as of the thin film magnetic memory device according to the third embodiment shown in FIG. 31 and the structure of the portion that covers a conductor film, which is a bit line, differs from that of the thin film magnetic memory device according to the third embodiment. In the following, descriptions of the parts of the structure that are the same as of the thin film magnetic memory device according to the third embodiment will not be repeated.

Conductor films 27 and 27m are formed so as to bring into contact with the top surfaces of TMR elements 24a and 24m. Conductor films 27 and 27m form first and second bit lines. Insulator films 94 and 94m made of silicon nitride films, for example, are formed so as to cover the sidewalls and the top surfaces of conductor films 27 and 27m.

A trench 82a for shielding whose sidewalls are defined by interlayer insulating film 59 and by insulator film 94 and whose bottom is defined by interlayer insulating film 25 is formed in interlayer insulating film 59 formed on interlayer insulating film 25. A trench 82b for shielding whose sidewalls are defined by insulator films 94 and 94m and whose bottom is defined by interlayer insulating film 25 is formed in interlayer insulating film 59. A trench 82c for shielding whose sidewalls are defined by interlayer insulating film 59 and by insulator film 94m and whose bottom is defined by interlayer insulating film 25 is formed in interlayer insulating film 59.

A magnetic film 95 is formed so as to fill in the insides of trenches 82a to 82c for shielding and so as to cover the top surfaces of interlayer insulating film 59 and of insulator films 94 and 94m. Magnetic film 95 is formed of a magnetic material of an alloy of cobalt-iron or an alloy of nickel-iron.

Magnetic film 95 of the thin film magnetic memory device according to the fourth embodiment of the present invention includes at least one of an alloy of cobalt-iron and an alloy of nickel-iron.

Insulator films 94 and 94m act as protective films for the first and second bit lines formed of conductor films 27 and 27m in the thin film magnetic memory device having the above described configuration. Insulator films 94 and 94m maintain insulation between the first and second digit lines and, therefore, it is not necessary to form magnetic film 95 of a magnetic material that has insulating properties. Therefore, freedom of selection of the magnetic material that forms magnetic film 95 is increased. Thus, the same effects as the effects described in the third embodiment can be obtained according to the thin film magnetic memory device having the above described configuration.

Here, a thin film magnetic memory device may be provided by combining the structure wherein a magnetic film is formed between the digit lines, such as in the first and second embodiments, and the structure wherein a magnetic film is formed between the bit lines, such as in the third and fourth embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:
   first and second magnetic memory cells provided in a main surface of a semiconductor substrate at a predetermined distance away from each other so as to operate as memory cells;
   a first wire for applying a magnetic field to the first magnetic memory cell extending in one direction so as to intersect the first magnetic memory cell;
   a second wire for applying a magnetic field to the second magnetic memory cell extending in parallel to the first wire so as to intersect the second magnetic memory cell; and
   a magnetic film provided so as to fill in the space between the first wire and the second wire and so as to bring into contact with the first and second wires.

2. The thin film magnetic memory device according to claim 1, wherein
   said first and second wires are provided between the main surface of the semiconductor substrate and said first and second magnetic memory cells.

3. The thin film magnetic memory device according to claim 1, wherein
   said first and second wires are provided so that said first and second magnetic memory cells are located between the main surface of the semiconductor substrate and said first and second wires.

4. The thin film magnetic memory device according to claim 1, wherein
   said magnetic film covers said first and second wires so that only the sides of said first and second wires facing said first and second magnetic memory cells are exposed.

5. The thin film magnetic memory device according to claim 1, wherein said magnetic film extends in the direction in which said first and second wires extend and said magnetic film extends at least the lengths of the sections wherein regions, in which said first and second magnetic memory cells, as well as said first and second wires, respectively, intersect each other, extend in the direction in which said first and second wires extend.

6. The thin film magnetic memory device according to claim 1, wherein said magnetic film includes an oxide of at least one type of element selected from the group consisting of manganese, zinc and iron.

7. A thin film magnetic memory device comprising:

first and second magnetic memory cells provided in a main surface of a semiconductor substrate at a predetermined distance away from each other so as to operate as memory cells;

a first wire for applying a magnetic field to the first magnetic memory cell extending in one direction so as to intersect the first magnetic memory cell;

a second wire for applying a magnetic field to the second magnetic memory cell extending in parallel to the first wire so as to intersect the second magnetic memory cell;

a magnetic film that fills in the space between the first wire and the second wire; and insulator films interposed between said first wire and said magnetic film as well as between said second wire and said magnetic film, respectively.

8. The thin film magnetic memory device according to claim 7, wherein said first and second wires are provided between the main surface of the semiconductor substrate and said first and second magnetic memory cells.

9. The thin film magnetic memory device according to claim 7, wherein said first and second wires are provided so that said first and second magnetic memory cells are located between the main surface of the semiconductor substrate and said first and second wires.

10. The thin film magnetic memory device according to claim 7, wherein said magnetic film covers said first and second wires so that only the sides of said first and second wires facing said first and second magnetic memory cells are exposed.

11. The thin film magnetic memory device according to claim 7, wherein said magnetic film extends in the direction in which said first and second wires extend and said magnetic film extends at least the lengths of the sections wherein regions, in which said first and second magnetic memory cells, as well as said first and second wires, respectively, intersect each other, extend in the direction in which said first and second wires extend.

12. The thin film magnetic memory device according to claim 7, wherein said magnetic film includes at least one of an alloy of cobalt-iron and an alloy of nickel-iron.

* * * * *